(12) United States Patent
Martinek et al.

(10) Patent No.: US 10,600,539 B2
(45) Date of Patent: Mar. 24, 2020

(54) CONTOURED-FIELD MAGNETS

(71) Applicant: Arnold Magnetic Technologies AG, Lupfig (CH)

(72) Inventors: Gerhard Martinek, Schafisheim (CH); Urs Wyss, Aarau (CH)

(73) Assignee: Magnetic Technologies AG, Lupfig (CH)

( * ) Notice: Subject to any disclaimer, the term of this patent is extended or adjusted under 35 U.S.C. 154(b) by 605 days.

(21) Appl. No.: 15/059,415

(22) Filed: Mar. 3, 2016

(65) Prior Publication Data

US 2016/0189839 A1 Jun. 30, 2016

Related U.S. Application Data

(63) Continuation of application No. 13/803,933, filed on Mar. 14, 2013, now Pat. No. 9,312,057.

(Continued)

(51) Int. Cl.
*H01F 1/06* (2006.01)
*H01F 7/02* (2006.01)
(Continued)

(52) U.S. Cl.
CPC ............. *H01F 1/06* (2013.01); *G01B 7/30* (2013.01); *G01D 5/145* (2013.01); *G01R 33/07* (2013.01);
(Continued)

(58) Field of Classification Search
CPC ....... G01D 5/145; H01F 7/02; H01F 41/0246; H01F 1/06; H01F 7/0273; G01B 7/30; G01R 33/07; H02K 1/27
See application file for complete search history.

(56) References Cited

U.S. PATENT DOCUMENTS

| | | |
|---|---|---|
| 4,536,230 A | 8/1985 | Landa et al. |
| 5,181,971 A | 1/1993 | Ohtsuka |

(Continued)

FOREIGN PATENT DOCUMENTS

| | | |
|---|---|---|
| JP | 61239608 | 10/1986 |
| JP | 661036 | 3/1994 |

(Continued)

OTHER PUBLICATIONS

Magnetic Materials: Hard Magnets, accessed online at https://www.birmingham.ac.uk/Documents/college-eps/metallurgy/research/Magnetic-Materials-Background/Magnetic-Materials-Background-9-Hard-Magnets.pdf on May 13, 2019 (Year: 2019).*

(Continued)

*Primary Examiner* — Daniel C. McCracken
(74) *Attorney, Agent, or Firm* — Weiss & Arons LLP

(57) ABSTRACT

Apparatus and methods for manufacturing magnets, and magnets, having magnetically oriented grains, and apparatus including such magnets. The field of a permanent magnet may be shaped by applying an external field to the material from which the magnet is made in such a way as to magnetize different regions of the material in different directions. The apparatus may include, and the methods may involve, a metal-powder press that may press metal powder in the presence of a magnetic field. The press may compress the powder in an axial direction. The field may have flux lines that are transverse to the axial direction. The field may have flux lines that are along the axial direction.

5 Claims, 24 Drawing Sheets

Related U.S. Application Data

(60) Provisional application No. 61/758,369, filed on Jan. 30, 2013.

(51) Int. Cl.
*G01B 7/30* (2006.01)
*G01R 33/07* (2006.01)
*H01F 41/02* (2006.01)
*H02K 1/27* (2006.01)
*G01D 5/14* (2006.01)

(52) U.S. Cl.
CPC ............ *H01F 7/02* (2013.01); *H01F 7/0273* (2013.01); *H01F 41/0246* (2013.01); *H02K 1/27* (2013.01)

(56) References Cited

U.S. PATENT DOCUMENTS 5,416,457 A    5/1995  Nakatsuka et al.
6,304,162 B1   10/2001 Nakatsuka et al.

FOREIGN PATENT DOCUMENTS

| JP | 2001-6924   | 1/2001  |
| JP | 2003-318012 | 11/2003 |
| JP | 2006222131  | 8/2006  |
| JP | 2007093569  | 4/2007  |
| JP | 2008209340  | 9/2008  |
| JP | 5234745     | 10/2009 |

OTHER PUBLICATIONS

Japanese Patent Office Action in Application No. 2014-012216, dated Mar. 2, 2018.

Mallinson, J.C., "One Sided Fluxes—A Magnetic Curiosity?" IEEE Transactions on Magnetics, vol. 9, Issue 4, Dec. 1973, Institute of Electrical and Electronics, Piscataway, New Jersey.

* cited by examiner

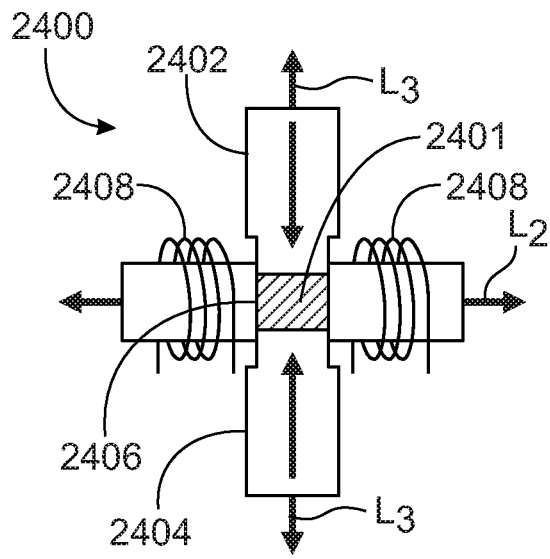
FIG. 24
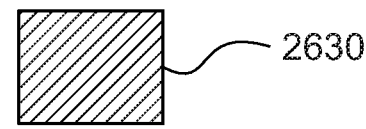
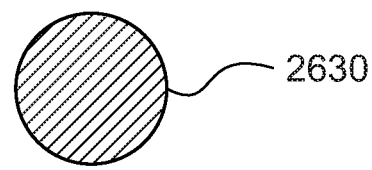
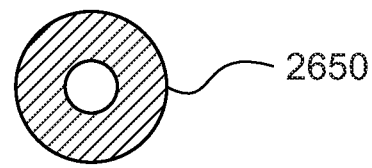
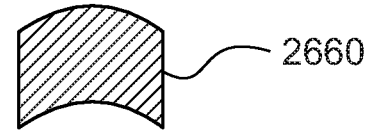
FIG. 26
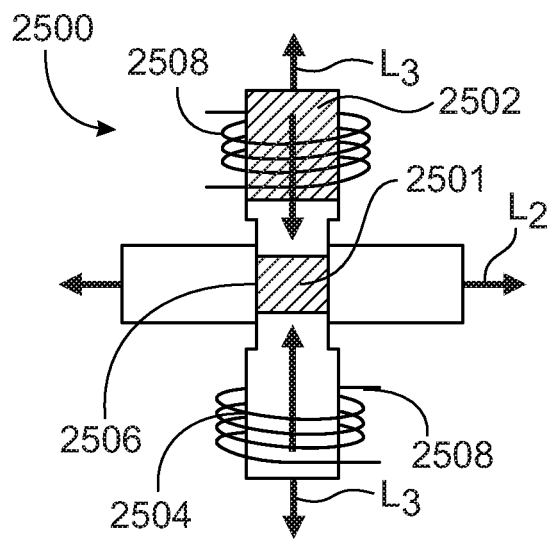
FIG. 25

CONTOURED-FIELD MAGNETS

CROSS-REFERENCE TO RELATED APPLICATIONS

This application is a continuation of U.S. application Ser. No. 13/803,933, filed Mar. 14, 2013, which is a nonprovisional of U.S. Provisional Application No. 61/758,369, filed on Jan. 30, 2013, both of which are hereby incorporated herein by reference in their respective entireties.

BACKGROUND

Permanent magnetic materials are used in a wide range of applications. The strength of a magnetic field generated by such a magnet may be limited by the orientations of grains or crystals in the materials.

It would therefore be desirable to provide magnets having grains oriented for increased field strength, apparatus and methods for making the magnets, and apparatus incorporating the magnets.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which:

FIG. 24 schematically shows still another illustrative apparatus in accordance with the principles of the invention;

FIG. 25 schematically shows yet another illustrative apparatus in accordance with the principles of the invention;

FIG. 26 schematically shows yet other illustrative products in accordance with the principles of the invention;

DETAILED DESCRIPTION

Figure 1:
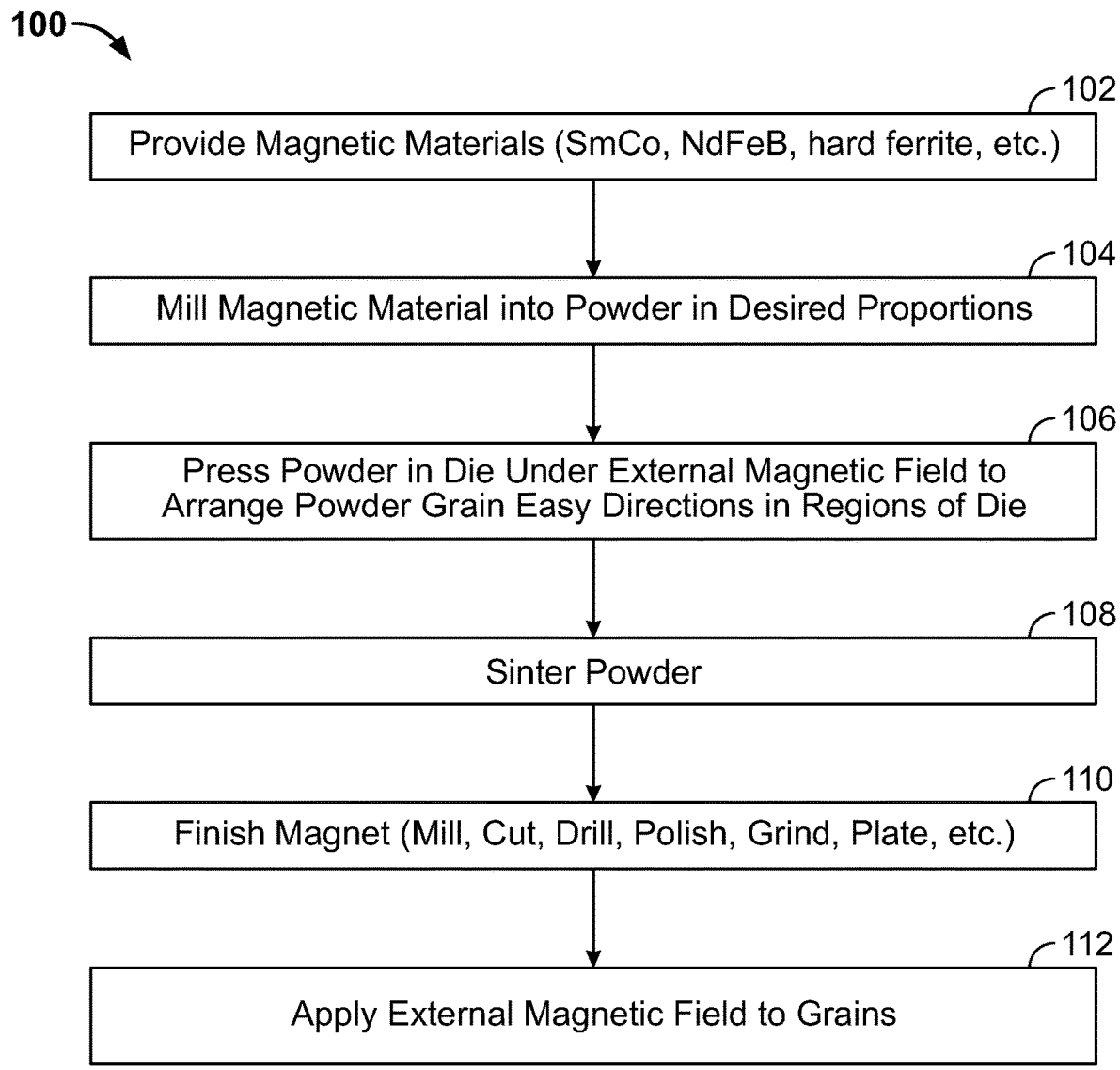
FIG. 1 shows illustrative process steps in accordance with the principles of the invention.

The field of a permanent magnet may be shaped by applying an external field to the material from which the magnet is made in such a way as to magnetize different regions of the material in different directions. Some materials have "easy directions," in which permanent magnetization may be established more easily than in other directions. When easy directions in a material are arranged in a manner that conforms to the desired field shape before the external field is applied to induce the permanent magnetization, the field generated by the permanent magnet may have increased strength.

Apparatus and methods for manufacturing magnets, and magnets, having magnetically oriented grains, and apparatus including such magnets, are provided.

The apparatus may include, and the methods may involve, a metal-powder press that may press metal powder in the presence of a magnetic field. The press may compress the powder in an axial direction. The field may have flux lines that are transverse to the axial direction. The field may have flux lines that are along the axial direction.

Method for Making Magnet

Transverse Field

Apparatus and methods for producing a magnet are provided. The methods may include placing grains of magnetic powder in a press. The grains may be polycrystalline. The grains may be monocrystalline. The grains may be vitreous. The grains may range in size from 10 micron to 1,000 micron. The grains may range in size from 1 micron to 200 micron. The press may define a compression axis and a die. The magnet may include grains with different orientations in different regions. The magnet may include first grains and second grains. The methods may include magnetically orienting the grains so that: in a first region of the die, radially apart from the compression axis, the first grains have first magnetic dipole moments that are inclined, relative to the central axis, at a first angle that is oblique to the compression axis; in a second region of the die, substantially along the compression axis, the second grains have second magnetic dipole moments that are substantially normal to the compression axis; and in a third region of the die, opposite the first region, the third grains have third magnetic dipole moments that are inclined, relative to the central axis, at a second angle that substantially mirrors the first angle.

The methods may include pressing the grains, along the compression axis, into a compact during the orienting.

The orienting may include subjecting the first, second and third grains to a magnetic field having flux lines to which the first, second and third grains align. The flux lines may be substantially continuous between the first and second regions. The flux lines may be substantially continuous between the second and third region.

Method for Making Magnet

Axial Field

The methods may include magnetically orienting the grains so that: in a first region of the die, radially apart from the compression axis, the first grains have first magnetic dipole moments that are inclined, relative to the central axis, at a first angle that is oblique to the compression axis; in a second region of the die, substantially along the compression axis, the second grains have second magnetic dipole moments that are substantially parallel to the compression axis; and, in a third region of the die, opposite the first region, the third grains have third magnetic dipole moments that are inclined, relative to the central axis, at a second angle that substantially mirrors the first angle.

The orienting may include subjecting the first, second and third grains to a magnetic field having flux lines to which the first, second and third grains align. The flux lines may be substantially continuous between the first and second regions. The flux lines may be substantially continuous between the second and third regions.

Press

Transverse Field

The apparatus may include, and the methods may involve, a magnetic powder press. The magnetic powder press may include a die for receiving magnetic powder. The die may have a first direction and a second direction. The second direction may be substantially orthogonal to the first direction. The press may include a magnetic flux source that is configured to provide magnetic flux substantially parallel to the first direction, from a first region of the die to a second region of the die. The first and second regions may be spaced apart from each other on opposite sides of a central region of the die. The press may include a first compression body that has a first magnetic permeability. The press may include a second compression body that has a second magnetic permeability. One or both of the compression bodies may be a punch.

The first and second compression bodies may be configured to compress the powder along the second direction. The first and second magnetic permeabilities may be imbalanced so that, when the bodies compress the powder, the flux is deflected in the second direction: in the central region, by a first offset; and, in the first and second regions, by a second offset. The second offset may be less than the first offset.

Press

Axial Field

The die may have a first direction and a second direction that is substantially orthogonal to the first direction. The magnetic flux source may be configured to provide magnetic flux substantially parallel to the second direction from a first region of the die to a second region of the die. The first and second regions may be spaced apart from each other on opposite sides of a central region of the die. The first and second magnetic permeabilities may be imbalanced so that, when the bodies compress the powder, the flux is deflected in the first direction: in the first region, by a first offset; and, in the second region, by a second offset that is greater than the first offset.

Magnet

Transverse Field

The apparatus may include a sintered hard magnet. The magnet may include a plurality of first sintered grains. The first sintered grains may have first magnetic easy directions substantially aligned together along a plane.

A magnetic easy direction may be a direction along which the grain is easily magnetized in response to an external magnetic field. The easy direction may be a crystallographic direction. The easy direction may be a crystallographic axis. The easy direction may be a net direction based on one or more crystallographic directions or crystallographic axes. When a grain is subjected to an external field, the grain may rotate to align the easy direction with the external field. After rotation, micromagnetic domains may shift to an orientation along the easy direction. If the domains are shifted with sufficient force to translate past energy barriers, such as dislocations, grain boundaries or other imperfections, the domains may become pinned in place and the magnet may become a "hard" magnet.

The magnet may include a plurality of second sintered grains, on one side of the first sintered grains. The second sintered grains may have second magnetic easy directions aligned together and inclined obliquely relative to the plane. The magnet may include third sintered grains, on an opposite side of the first sintered grains. The third sintered grains may have third magnetic easy directions that substantially mirror the second easy directions.

The first magnetic easy directions may define a first average direction. At least 50% of the first easy directions may be aligned within about 5 degrees of the first average direction. At least 67% of the first easy directions may be aligned within about 5 degrees of the first average direction.

At least 97% of the first easy directions may be aligned within about 5 degrees of the first average direction.

The second magnetic easy directions may define a second average direction. At least 50% of the second easy directions may be aligned within about 5 degrees of the second average direction. At least 67% of the second easy directions may be aligned within about 5 degrees of the second average direction. At least 97% of the second easy directions may be aligned within about 5 degrees of the second average direction.

The third magnetic easy directions may define a third average direction. At least 50% of the third easy directions may be aligned within about 5 degrees of the third average direction. At least 67% of the third easy directions may be aligned within about 5 degrees of the third average direction. At least 97% of the third easy directions may be aligned within about 5 degrees of the third average direction.

The first, second and third sintered grains may be part of a grain network that is interconnected exclusively by contemporaneously grown intergranular necks. The intergranular necks may all result from a common thermal treatment history. Two or more of the first, second and third sintered grains may be individually sintered and then joined to another of the first, second and third sintered grains by adhesive, welding or other post-sintering process or by a thermal treatment subsequent to the sintering of the first sintered grains, the sintering of the second sintered grains and the sintering of the third sintered grains.

The easy directions in the network may vary substantially continuously between the second and first sintered grains and between the first and third sintered grains.

The magnet may have a substantially planar face. The magnet may include a plurality of first sintered grains. The first sintered grains may have first magnetic easy directions aligned substantially parallel to the face. The magnet may include a plurality of second sintered grains. The second sintered grains may be disposed on one side of the first sintered grains. The second sintered grains may have second magnetic easy directions that are substantially co-aligned and collectively inclined at oblique angles relative to the face. The magnet may include a plurality of third sintered grains. The third sintered grains may be disposed on an opposite side of the first sintered grains. The third sintered grains may have third magnetic easy directions that substantially mirror the second easy directions.

The face may have a diameter in the range from about 1 mm to about 100 mm and a thickness in a range from about 0.5 mm to about 75 mm. The face may define a central axis that is normal to the face. The magnet may generate, at a location $X_1$ mm from the face, along the central axis, and $Y_1$ mm radially away from the central axis, a magnetic field component that is parallel to the central axis. Compared to a magnet in which the magnetization direction is essentially the same throughout the magnet volume, the magnetic field component normal to the face at $X_1$ from the face and $Y_1$ away from the central axis, is stronger. The normal component magnitude may vary sinusoidally in the circumferential direction around the central axis. The peak value of the normal component may be referred to as $H_{normal}$.

The face may be a first face. The first face may define a "hot" side of the magnet. The magnet may include a second face that may be parallel to the first face and is set apart from the first face by a thickness. The magnetic field, at a location $X_2$ mm from the second face, along the central axis, and $Y_2$ mm radially away from the central axis, normal to the second face, may have a magnitude that is less than the magnitude at $X_1$, $Y_1$ on the hot side. The second face may define a "cold" side of the magnet.

The magnet may generate on the hot side, at a location $X_1$ mm from the first face, along the central axis, and $Y_1$ mm radially away from the central axis, a magnetic field component that is circumferential to the central axis. The circumferential component magnitude may vary sinusoidaly in the circumferential direction around the central axis. The peak value of the circumferential component may be referred to as $H_{parallel}$ (to indicate that it is parallel to the face).

Table 1 shows for illustrative magnet diameters D and thicknesses t illustrative values of magnetic field strengths $B_{normal}$ (normal to magnet face; also referred to as $H_{axial}$, wherein "axial" indicates parallel to the central axis) and $B_{parallel}$ (parallel to magnet face; also referred to as $H_\theta$, wherein "θ" indicates circumferential about the central axis), at axial displacements $X_1$ from the first face and $Y_1$ from the axis, on the hot side, and axial displacements $X_2$ from the second face and $Y_2$ from the axis, on the cold side.

TABLE 1

Illustrative magnet diameters D and thicknesses t along with illustrative values of magnetic field strengths. The field strengths were calculated by finite element modeling and are relative to a constant polarization of J = 0.1 Tesla ($10^3$ Gauss) throughout the modeled magnet volume. Hot side estimates may exceed empirical results. Cold side estimates may have error of about 2-fold because of the cancelation of modeled vector fields.

| | | Distance | Distance $Y_1$, | Hot side | | Cold side | |
|---|---|---|---|---|---|---|---|
| Diameter (mm) | Thickness (mm) | $X_1$, $X_2$ from face (mm) | $Y_2$ from central axis (mm) | $B_{parallel}$ ($10^3$- Gauss) | $B_{normal}$ ($10^3$- Gauss) | $B_{parallel}$ ($10^3$- Gauss) | $B_{normal}$ ($10^3$- Gauss) |
| 6 | 2.5 | 4 | 0 | 33 | 0 | 11 | 0 |
| 6 | 2.5 | 4 | 1 | 29 | 15 | 11 | 2 |
| 10 | 2.5 | 4 | 0 | 62 | 0 | 2 | 0 |
| 10 | 2.5 | 4 | 1 | 58 | 23 | 0 | 6 |
| 6 | 5 | 4 | 0 | 42 | 0 | 21 | 0 |
| 6 | 5 | 4 | 1 | 38 | 18 | 21 | 6 |
| 10 | 5 | 4 | 0 | 83 | 0 | 15 | 0 |
| 10 | 5 | 4 | 1 | 79 | 28 | 17 | 2 |

The magnet may have a face, a diameter between about 5 mm and about 7 mm and a thickness between about 1.5 mm and about 3.5 mm. The magnet may define, normal to the face, a central axis. The magnet may generate a magnetic field that, at a location about 3 mm from the face and about 1 mm radially away from the central axis, has a component that is parallel to the central axis and has a magnitude that is greater than 400 Gauss.

The face may be a first face. The location may be a first location. The magnet may include a second face that is substantially parallel to the first face and is set apart from the first face by the thickness. The magnetic field component, at a second location 3 mm from the second face and opposite the first location, may have a magnitude that is less than 150 Gauss.

The diameter may be about 6 mm and the thickness may be about 2.5 mm.

The magnitude at the first location may be greater than 410 Gauss.

The magnitude at the first location may be greater than 420 Gauss.

The magnitude at the first location may be greater than 430 Gauss.

The magnitude at the first location may be greater than 440 Gauss.

The magnitude at the first location may be greater than 450 Gauss.

The magnet may have a face, a diameter between about 5 mm and about 7 mm and a thickness between about 1.5 mm and 3.5 mm. The magnet may define, normal to the face, a central axis. The magnet may generate a magnetic field that, at a location about 3 mm from the face and about 1 mm radially away from the central axis, has a component that is parallel to the face and has a magnitude that is greater than 520 Gauss.

The face may be a first face and the location may be a first location. The magnet may include a second face that is substantially parallel to the first face and is set apart from the first face by the thickness. The magnetic field component, at a second location 3 mm from the second face and opposite the first location, may have a magnitude that is less than 300 Gauss.

The diameter may be about 6 mm and the thickness may be about 2.5 mm.

The magnitude at the first location may be greater than 535 Gauss.

The magnitude at the first location may be greater than 545 Gauss.

The magnitude at the first location may be greater than 560 Gauss.

The magnitude at the first location may be greater than 575 Gauss.

The magnitude at the first location may be greater than 585 Gauss.

Magnet
Axial Field

The magnet may have a magnetic axis that traverses from a first region of the magnet to a second region of the magnet. The magnet may include a plurality of first sintered grains in the first region. The first sintered grains may have first magnetic easy directions aligned substantially together and substantially parallel to the axis. The magnet may include a plurality of second sintered grains in the second region. The second sintered grains may be set apart from the axis. The second sintered grains may have second magnetic easy directions that are inclined away from the axis. This magnet may be referred to as a "flux focusing magnet."

The first magnetic easy directions may define a first average direction. At least 50% of the first easy directions may be aligned within about 5 degrees of the first average direction. At least 67% of the first easy directions may be aligned within about 5 degrees of the first average direction. At least 97% of the first easy directions may be aligned within about 5 degrees of the first average direction.

The second magnetic easy directions may define a second average direction. At least 50% of the second easy directions may be aligned within about 5 degrees of the second average direction. At least 67% of the second easy directions may be aligned within about 5 degrees of the second average direction. At least 97% of the second easy directions may be aligned within about 5 degrees of the second average direction.

The magnet may have a magnetic axis. The magnet may include a top surface normal to the axis. The magnet may include a bottom surface normal to the axis. The bottom surface may be set apart from the top surface by a thickness. The thickness may be between about 3 mm and about 6 mm. The magnet may generate a magnetic field that at a location about 4 mm from the top surface has a component that is parallel to the axis and has a magnitude greater than 1500 Gauss.

The location may be a first location. The magnetic field component at a second location 4 mm from the bottom surface and opposite the first location, may have a magnitude that is less than 1000 Gauss.

One or both of the top surface and the bottom surface may have a length between about 28 and about 32 mm. One or both of the top surface and the bottom surface may have a width between about 13 and about 15 mm.

The length may be about 30 mm. The length may be about 30.15 mm.

The width may be about 14 mm. The width may be about 13.8 mm.

The thickness may be about 4 mm. The thickness may be about 4.2 mm.

The magnetic axis may traverse from a first region of the magnet to a second region of the magnet. A plurality of first sintered grains in the first region may have first magnetic easy directions aligned together substantially parallel to the axis. A plurality of second sintered grains in the second region and set apart from the axis may have second magnetic easy directions that are inclined away from the axis.

The magnet may include a top surface and a bottom surface. The bottom surface may be set apart from the top surface by a thickness. The magnet may generate a magnetic field that, at a first location 0.5×thickness along the magnetic axis away from the top face, has a component parallel to the axis having a magnitude that is no less than 1.5 times greater than the same component at a second location 0.5×thickness along the magnetic axis away from the bottom face.

Sensor

The apparatus may include an angular displacement indicator. The indicator may include a sintered powder magnet. The magnet may have a substantially planar face normal to a rotation axis. The indicator may include a sensor that is configured to output a voltage that is proportional to an angular displacement between the magnet and the sensor. The magnet may include grains that have magnetic dipoles that form a curved pattern that, near the axis, is substantially tangent the face. At locations far away from the axis of the magnet, the dipoles may be inclined at angles from about 5° to about 10°, from about 10° to about 15°, from about 15° to about 20°, from about 20° to about 25°, from about 25° to about 30°, from about 30° to about 35° to the tangential direction. The dipoles may be at angles greater than 30° to the tangential direction. The sensor may sense a magnetic field from the magnet. The magnetic field may be parallel to the rotation axis. The sensor may be a Hall effect sensor or magnetoresistive sensor.

Coupler

The apparatus may include one or two (or any suitable number of) rotors for transferring torque. The rotor may define a circumferential direction and a radial direction. The rotor may include a first flux focusing magnet. The first flux focusing magnet set radially apart from a rotational axis, the magnetic axis of the first flux focusing magnet being substantially aligned with the radial direction, the second region of the first flux focusing magnet being at a greater radial distance from the axis than the first region of the first flux focusing magnet.

The rotor may include a second flux focusing magnet. The second flux focusing magnet may be displaced circumferentially from the first flux focusing magnet by a circumferential offset. The magnetic axis of the second flux focusing magnet may be substantially aligned with the radial direction. The second region of the second flux focusing magnet may be at a lesser radial distance from the axis than the first region of the second flux focusing magnet.

The first magnet may define the radial thickness of an annulus about the axis. The first magnet may be one of a plurality of magnets in the annulus. The plurality may include from about 10 to about 16 magnets.

Each of the plurality of magnets may have a width in the circumferential direction of about 10 mm; and neighboring magnets of the plurality of magnets may be separated by a gap in the circumferential direction of about 1 mm.

The first magnet may have a circumferential span of about 0.1 to 0.2 radian.

The outer radial extent of the first magnet or the second may define an outer radius. The outer radius may be greater than 50, 60, 70, 80, 90, 100, 120, 140, or 160 millimeter. The outer radius may be greater than 5 millimeter.

An inner radial extent of the first focused flux magnet or the second focused flux defines an inner radius. The first focused flux magnet is configured to be radially aligned with a third focused flux magnet that is located at a radius less than the inner radius. The second focused flux magnet may be configured to be radially aligned with a fourth focused flux magnet that is located at a radius less than the inner radius.

The magnetic axis of the third focused flux magnet may be substantially aligned with the radial direction. The second region of the third focused flux magnet may be at a lesser radial distance from the axis than the first region of the third focused flux magnet.

The magnetic axis of the fourth focused flux magnet may be substantially aligned with the radial direction. The second region of the fourth focused flux magnet may be at a greater radial distance from the axis than the first region of the fourth focused flux magnet. The third and fourth focused flux magnets may be configured to magnetically couple to the first and second focused flux magnets, respectively, and to orbit about the axis.

Apparatus and methods in accordance with the invention will now be described in connection with the FIGS. The features are illustrated in the context of selected embodiments. It will be understood that features shown in connection with one of the embodiments may be practiced in accordance with the principles of the invention along with features shown in connection with another of the embodiments.

Apparatus and methods described herein are illustrative. Apparatus and methods of the invention may involve some or all of the features of the illustrative apparatus and/or some or all of the steps of the illustrative methods. The steps of the methods may be performed in an order other than the order shown and described herein. Some embodiments may omit steps shown and described in connection with the illustrative methods. Some embodiments may include steps that are not shown and described in connection with the illustrative methods.

FIG. 1 shows illustrative steps of process 100 for producing magnets. The process may begin at step 102. At step 102, magnetic materials may be provided. The materials may include Cobalt, Samarium, Iron, Copper, Zirconium or other suitable materials. At step 104, the materials may be milled into powder and combined in desired proportions. At step 106, the powder may be pressed in a die under an external magnetic field to arrange powder grain easy directions in different regions of the die. At step 108, the powder may be sintered at high temperature. At step 110, the sintered powder may be finished by milling, cutting, drilling, polishing, grinding, plating or any other suitable process. At step 112, an external magnetic field may be applied to the sintered powder. The external magnetic field may conform to the arrangement of powder grain easy directions in the sintered powder. One or more of the apparatus shown and described below may be used to perform one or more of the steps of process 100.

Figure 2:
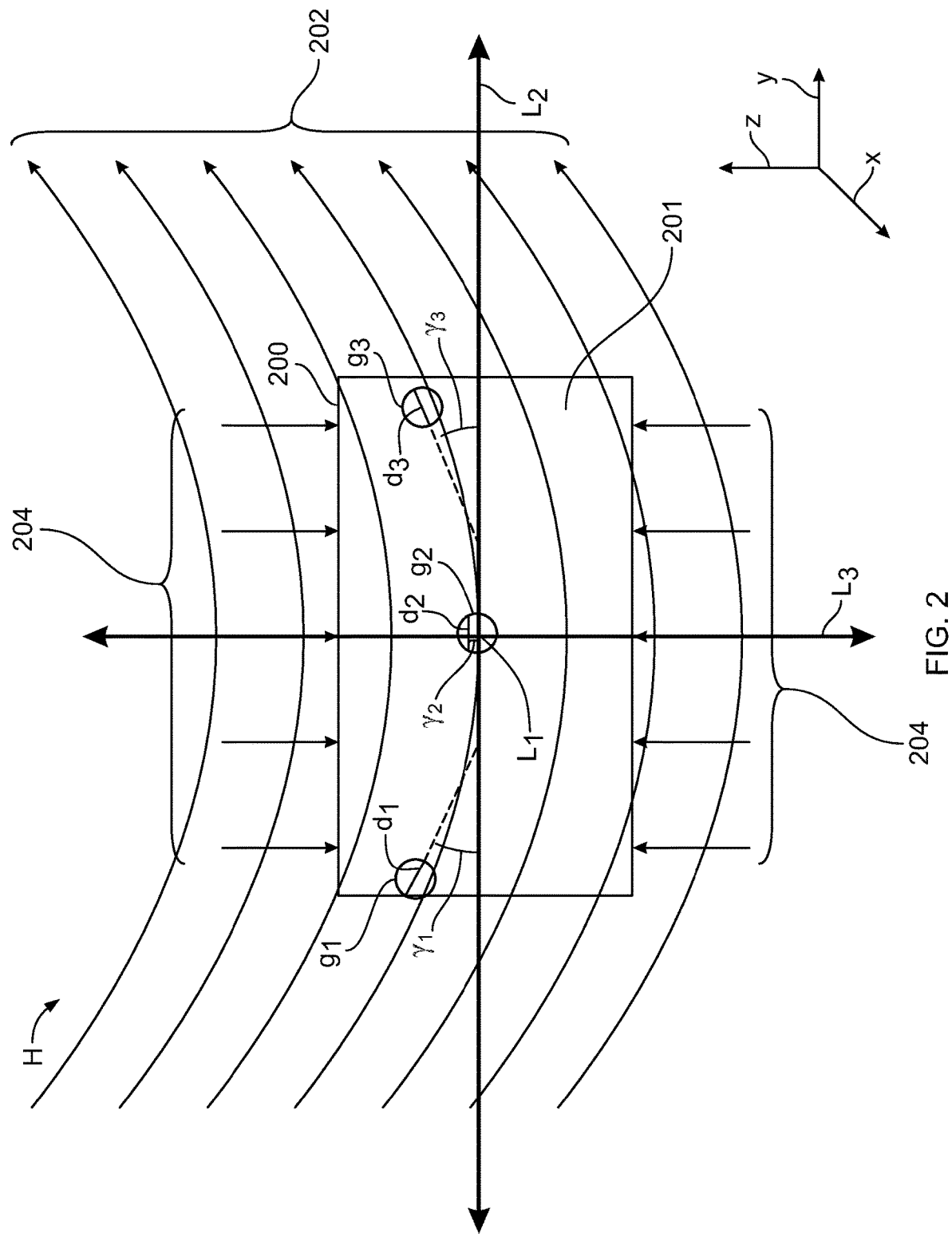
FIG. 2 schematically shows illustrative apparatus in accordance with the principles of the invention.

FIG. 2 show illustrative metal powder grains $g_1$, $g_2$ and $g_3$ in die 200. Die 200 may have any suitable shape. Die 200 may be a parallelepiped. Die 200 may be rectilinear. Die 200 may be cylindrical. Die 200 may be conical. Die 200 may be trapezoidal. Die 200 may be crescent-shaped. Die 200 may be filled with metallic powder grains 201. Grains $g_1$, $g_2$ and $g_3$ have magnetic easy directions $d_1$, $d_2$ and $d_3$ rotated into alignment with curved magnetic flux lines 202. Grains $g_1$, $g_2$ and $g_3$ may represent pluralities of grains in regions of the powder that correspond to the grains. Easy directions $d_1$, $d_2$ and $d_3$ may be inclined relative to axis $L_2$ at angles $\gamma_1$, $\gamma_2$ and $\gamma_3$. Flux lines 202 correspond to externally imposed magnetic field H. Field H may be provided by a source such as a coil (not shown). Field H may include components $H_x$, $H_y$ and $H_z$, that may vary along axes $L_1$, $L_2$ and $L_3$.

Force lines 204 show compress force that may be applied along axis $L_3$ to compact the powder grains, in the presence of the external field, into a metallic compact. Axis $L_1$ is orthogonal to axes $L_2$ and $L_3$.

Figure 3:
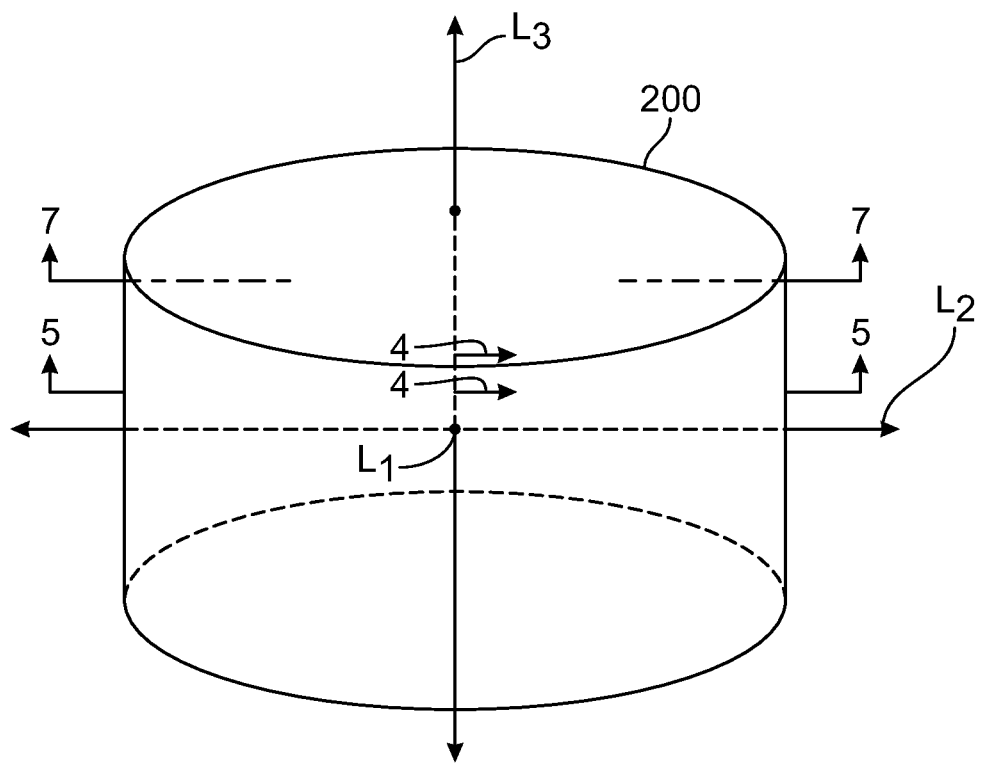
FIG. 3 schematically shows a portion of the apparatus shown in FIG. 2.

FIG. 3 illustrates die 200 as a cylinder.

Figure 4:
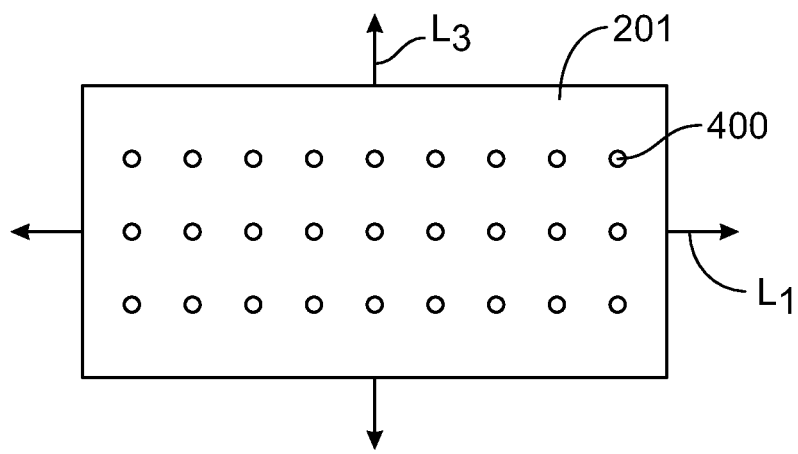
FIG. 4 schematically shows material being used in accordance with the principles of the invention.

FIG. 4 schematically shows a cross section of powder grains 201 taken along view lines 4-4 (shown in FIG. 3). Circles 400 illustrate easy directions of grains 201. The easy directions are illustrated as being normal to the plane of FIG. 4. In some embodiments, there may be up to about a 5-degree divergence in the easy directions of grains 201. In some embodiments, there may be a divergence in the easy directions of grains 201 that is greater than 5°.

Figure 5:
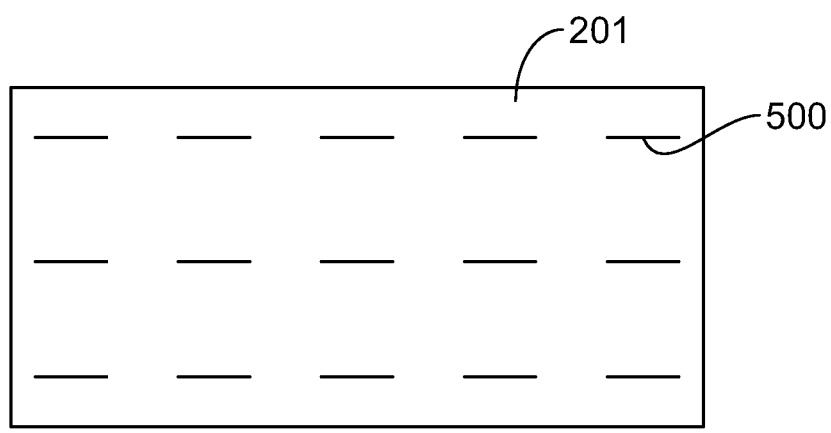
FIG. 5 schematically shows, in a view taken along lines 5-5 (shown in FIG. 2), a different view of the material shown in FIG. 4.

FIG. 5 schematically shows a cross section of easy directions 500 of grains 201 taken along view lines 5-5 (shown in FIG. 3). Easy directions 500 are arranged in a pattern that conforms to flux lines 202 (shown in FIG. 2).

Figure 6:
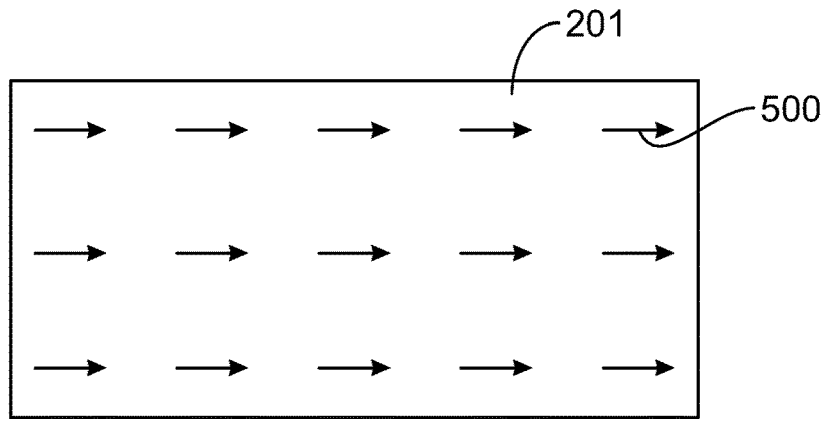
FIG. 6 schematically shows features of the material shown in FIG. 4.

FIG. 6 schematically shows magnet dipoles 600 of grains 201 in the presence of a magnetic field such as H, corresponding to flux lines 202, or as a result of permanent magnetization by a field conforming to easy directions 500.

Figure 7:
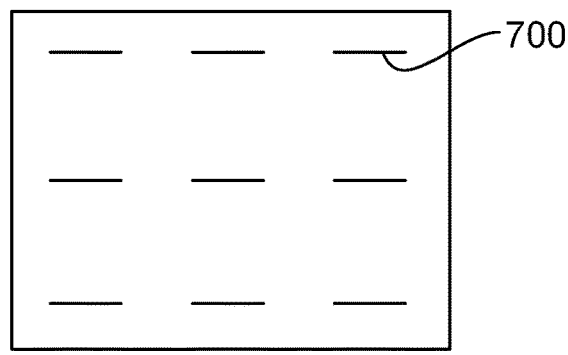
FIG. 7 schematically shows, in a view taken along lines 7-7 (shown in FIG. 2), a different view of the material shown in FIG. 4.

FIG. 7 schematically shows a cross section of easy directions 700 of grains 201 taken along view lines 7-7 (shown in FIG. 3). The view in FIG. 7 shows a cross section that is displaced, along the $L_1$ axis, relative to the view in FIG. 5, in a direction away from the center of die 200. Because die 200 is illustrated as a cylinder, the view along lines 7-7 is normal to a chord of the cylinder and is therefore of a smaller "width" than view 5-5, which is normal to a diameter of the cylinder. Easy directions 700 are arranged in substantially the same pattern as that in which easy directions 500 (shown in FIG. 5) are arranged. This shows that field H (shown in FIG. 2) may be sufficiently uniform in direction $L_1$ that the orientation of grain 201 easy directions substantially conforms to flux lines 202 of field H in direction $L_1$. When edge effects are present, easy directions of grains 201 near the edge of die 200 may not conform to flux lines 202 of field H.

Figure 8:
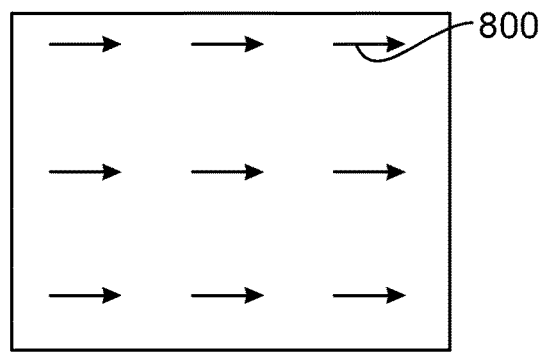
FIG. 8 schematically shows features of the material shown in FIG. 4.

FIG. 8 schematically shows magnetic dipoles 800 of grains 201 in the presence of a magnetic field such as H, corresponding to flux lines 202, or as a result of permanent magnetization by a field conforming to easy directions 700.

Figure 9:
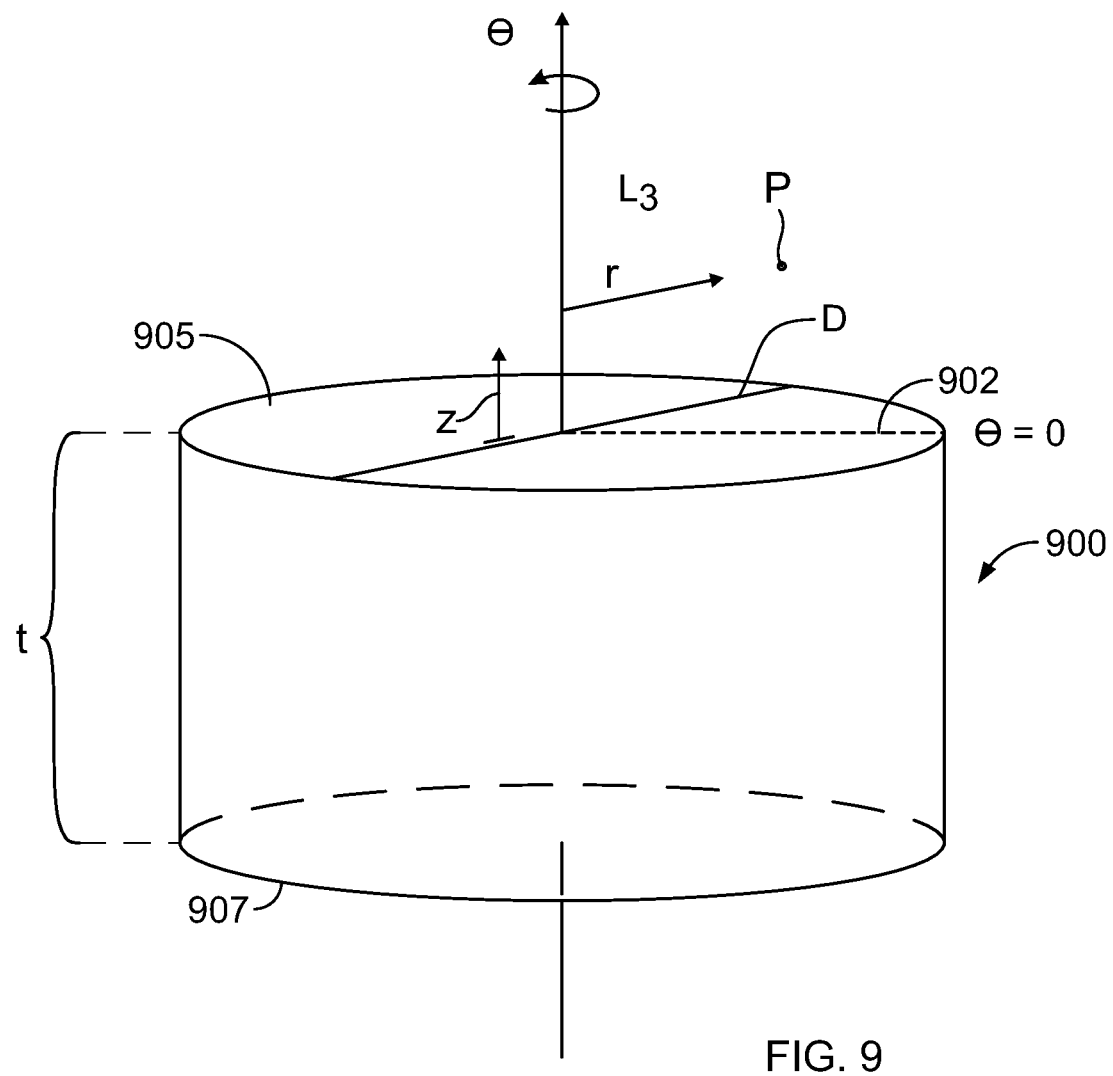
FIG. 9 schematically shows an illustrative product in accordance with the principles of the invention.

FIG. 9 shows illustrative disc-shaped magnet 900, which may be made by compression of grains 201 in die 200 subject to magnetic field H. After compression, grains 201 were sintered in an oven and cooled. A magnetic field H' was applied to magnet 900 to remagnetize magnet 900 after sintering. Magnetic field H' may be a substantially uniform linear (i.e., not shaped) magnetic field. Magnetic field H' may be shaped to coincide with the easy directions induced prior to sintering by magnetic field H. After removal of magnetic field H', magnet 900 retains magnet dipoles that generate external magnetic field H".

Field H" at point P has axial component $H''_z$, radial component $H''_r$ and circumferential component $H''_\theta$. $H''_r$ may vary sinusoidally about axis $L_3$. The peak values of $H''_z$ may correspond to $B_{normal}$ (listed in Table 1) or $-B_{normal}$. $H''_\theta$ may vary sinusoidally about axis $L_3$. The peak values of $H_\theta$ may correspond to $B_{parallel}$ (listed in Table 1) or $-B_{parallel}$.

The magnitudes of the components may depend on the composition of grains 201, the overall density of grains 201, the degree of compression of grains 201, the strength of fields H and H', the shape fields H and H', magnet thickness t, magnet diameter D and other factors.

Magnet 900 may have hot side 905. Magnet 900 may include cold side 907. Magnetic field strength adjacent hot side 905 may be greater than that adjacent cold side 907.

Table 2 shows illustrative modeled field magnitudes $H''_r$ (z=3 mm, r=1 mm, θ=0) and $H''_z$(z=3 mm, r=1 mm, θ=0) for a magnet such as 900 when the average polarization is 1.07 Tesla, magnet diameter is 6+/−0.05 mm and magnet thickness is 2.5+/−0.05 mm. θ=0 corresponds to the plane of FIG. 2. The illustrative values are based on finite element model solutions.

TABLE 2

Illustrative values of $H''_r$ and $H''_z$ for a magnet such as 900.

| Side of magnet | $H''_r$ (Gauss) | $H''_z$ (Gauss) |
| --- | --- | --- |
| Hot | 520 | 400 |
| Cold | 300 | 150 |

Values greater than the hot side values shown in Table 2 may be achieved, for example, by increasing one or more of the overall density of grains 201, the degree of compression of grains 201, the strength of field H, the strength of field H', the curvature of field H, the curvature of field H' and any other suitable factor. The higher values may be from about 1% to about 2%, from about 2% to about 3%, from about 3% to about 4%, from about 4% to about 5%, from about 5% to about 6%, from about 6% to about 7%, from about 7% to about 8%, from about 8% to about 9%, from about 9% to about 10%, from about 10% to about 12%, from about 12% to about 14%, from about 14% to about 16%, from about 16% to about 18%, from about 18% to about 20%, from about 20% to about 25%, and from about 25% to about 30% higher, or more than 30% higher, than the values shown in Table 2.

Values lesser than the cold side values shown in Table 2 may be achieved, for example, by increasing one or more of the overall density of grains 201, the degree of compression of grains 201, the strength of field H, the strength of field H', the curvature of field H, the curvature of field H' and any other suitable factor. The lower values may be from about 1% to about 2%, from about 2% to about 3%, from about 3% to about 4%, from about 4% to about 5%, from about 5% to about 6%, from about 6% to about 7%, from about 7% to about 8%, from about 8% to about 9%, from about 9% to about 10%, from about 10% to about 12%, from about 12% to about 14%, from about 14% to about 16%, from about 16% to about 18%, from about 18% to about 20%, from about 20% to about 25%, and from about 25% to about 30% lower, or more than 30% lower, than the values shown in Table 2.

Figure 10:
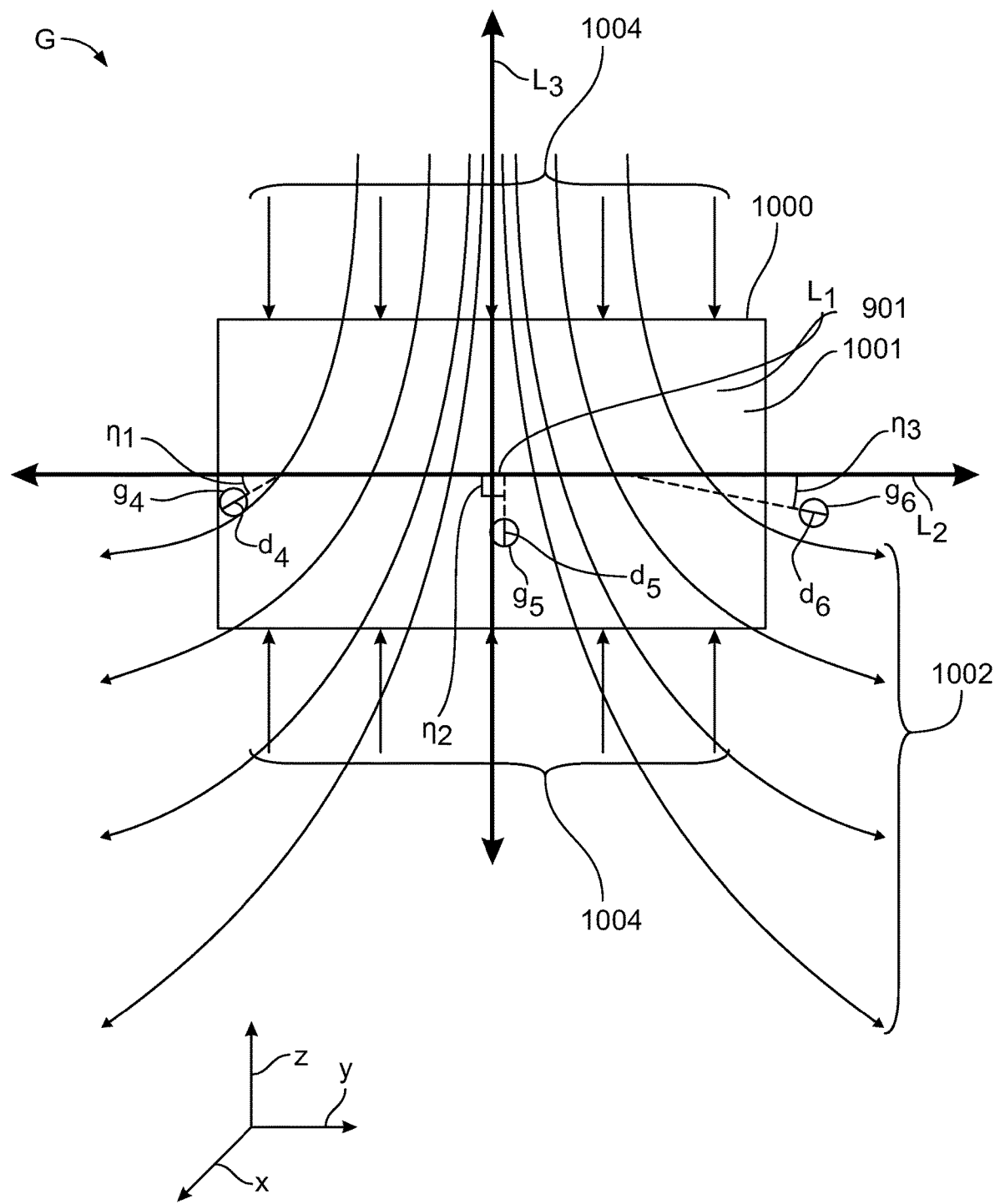
FIG. 10 schematically shows other illustrative apparatus in accordance with the principles of the invention.

FIG. 10 show illustrative metal powder grains $g_4$, $g_5$ and $g_6$ in die 1000. Die 1000 may have any suitable shape. Die 1000 may be rectilinear. Die 1000 may be a parallelepiped. Die 1000 may be cylindrical. Die 1000 may be conical. Die 1000 may be trapezoidal. Die 100 may be crescent-shaped. Die 1000 may be filled with metallic powder grains 1001. Grains $g_4$, $g_5$ and $g_6$ have magnetic easy directions $d_4$, $d_5$ and $d_6$ rotated into alignment with curved magnetic flux lines 1002. Grains $g_4$, $g_5$ and $g_6$ may represent pluralities of grains in regions of the powder that correspond to the grains. Easy directions $d_4$, $d_5$ and $d_6$ may be inclined relative to axis $L_2$ at angles $\eta_1$, $\eta_2$ and $\eta_3$. Flux lines 1002 correspond to externally imposed magnetic field H. Field H may be provided by a source such as a coil (not shown). Field G may include components $G_x$, $G_y$ and $G_z$, that may vary along axes $L_1$, $L_2$ and $L_3$.

Force lines 1004 show compress force that may be applied along axis $L_3$ to compact the powder grains, in the presence of field G, into a metallic compact. Axis $L_1$ is orthogonal to axes $L_2$ and $L_3$.

Figure 11:
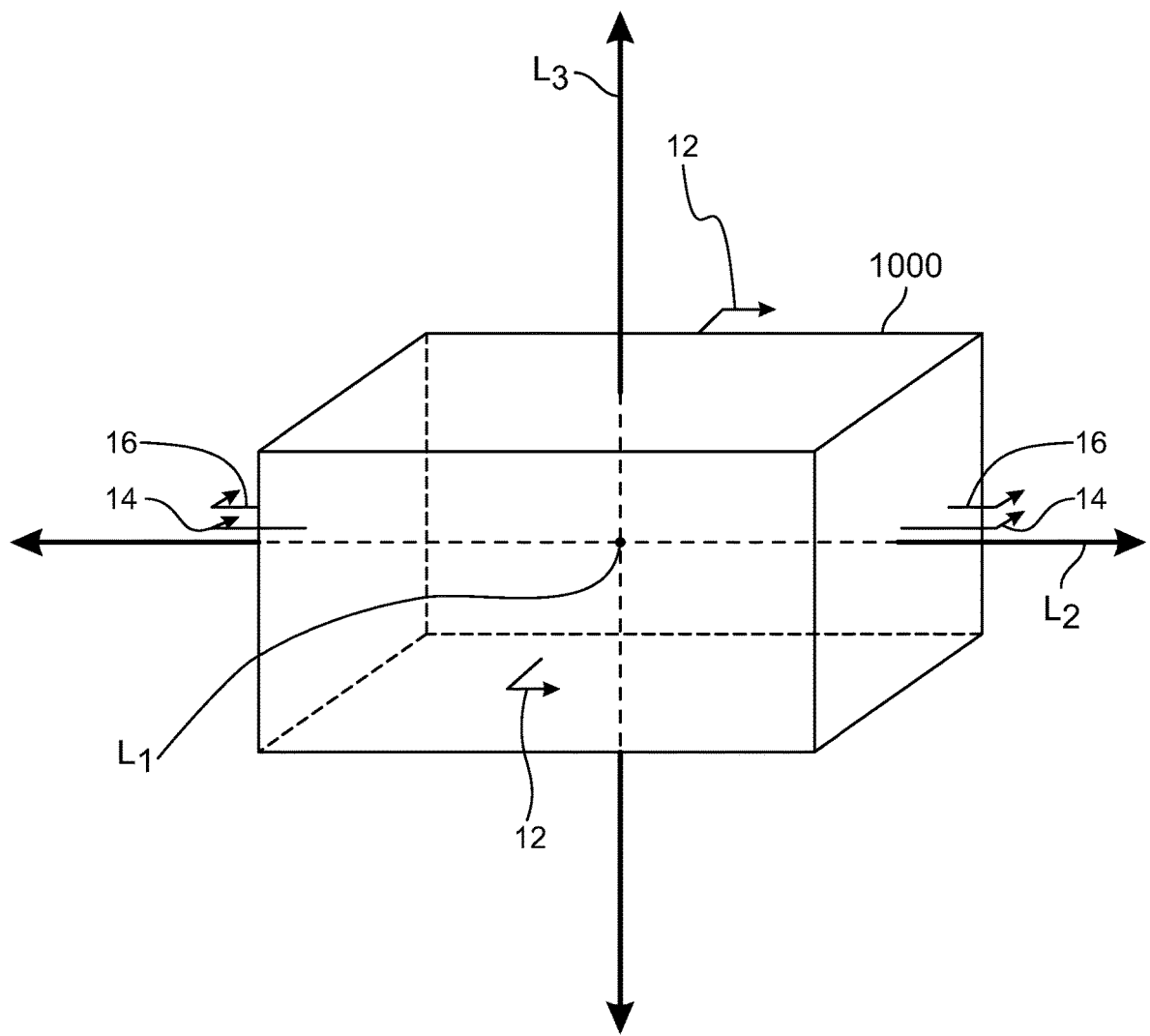
FIG. 11 schematically shows a portion of the apparatus shown in FIG. 10.

FIG. 11 illustrates die 1000 as a parallelepiped.

Figure 12:
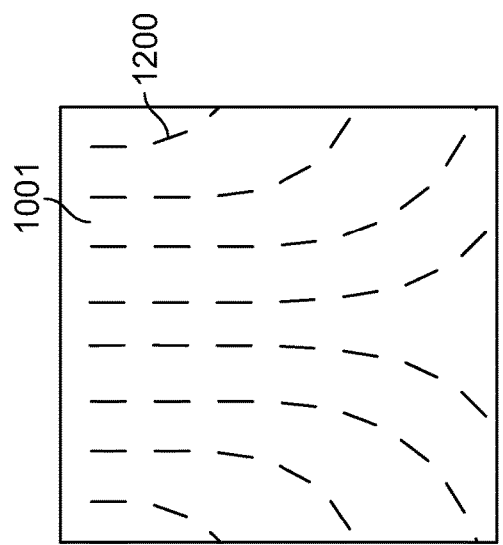
FIG. 12 schematically shows, in a view taken along lines 12-12 (shown in FIG. 11), a material being used in accordance with the principles of the invention.

FIG. 12 schematically shows a cross section of easy directions 1200 of grains 1001 taken along view lines 12-12 (shown in FIG. 11). Easy directions 1200 are arranged in a pattern that conforms to flux lines 1002 (shown in FIG. 10).

Figure 13:
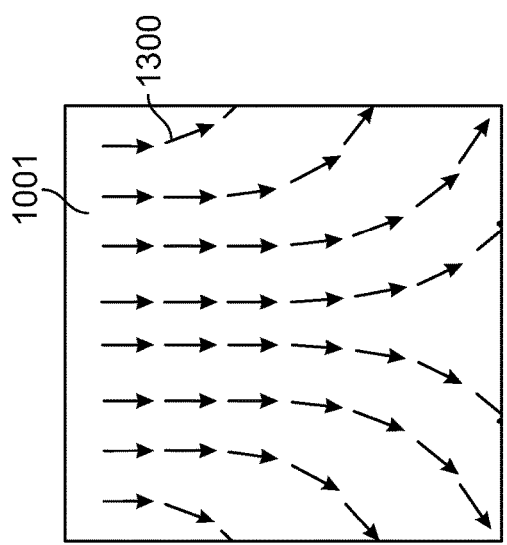
FIG. 13 schematically shows features of the material shown in FIG. 12.

FIG. 13 schematically shows magnet dipoles 1300 of grains 1001 in the presence of a magnetic field such as G, corresponding to flux lines 1002, or as a result of permanent magnetization by a field conforming to easy directions 1200.

Figure 14:
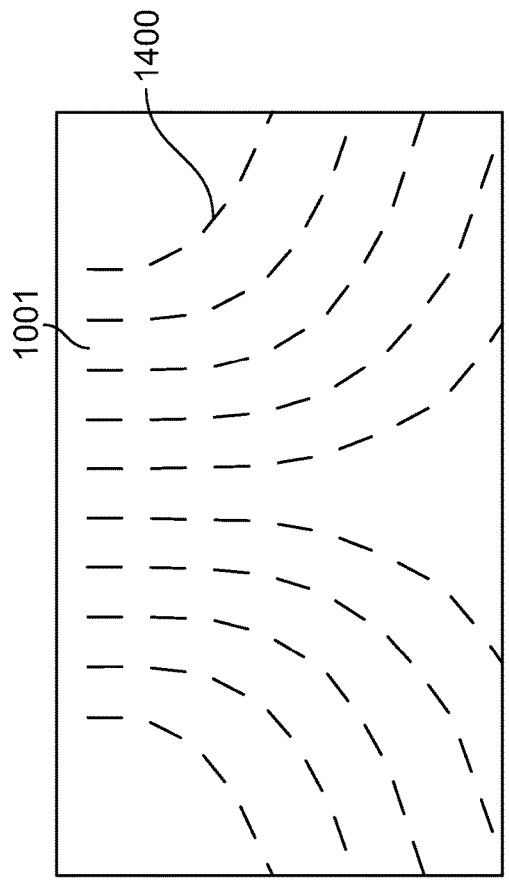
FIG. 14 schematically shows, in a view taken along lines 14-14 (shown in FIG. 11), a different view of the material shown in FIG. 12.

FIG. 14 schematically shows a cross section of easy directions 1400 of grains 1001 taken along view lines 14-14 (shown in FIG. 11). Easy directions 1400 are arranged in a pattern that conforms to flux lines 1002 (shown in FIG. 10).

Figure 15:
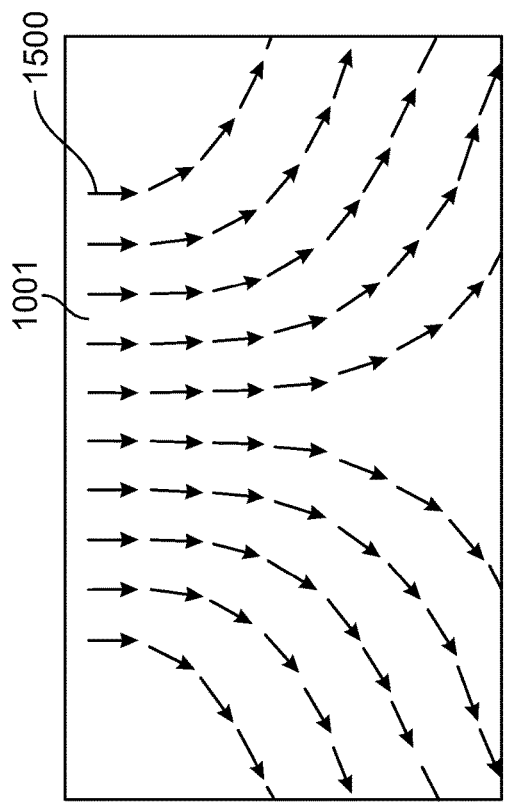
FIG. 15 schematically shows features of the material shown in FIG. 12.

FIG. 15 schematically shows magnetic dipoles 1500 of grains 1001 in the presence of a magnetic field such as G, corresponding to flux lines 1002, or as a result of permanent magnetization by a field conforming to easy directions 1400.

Figure 16:
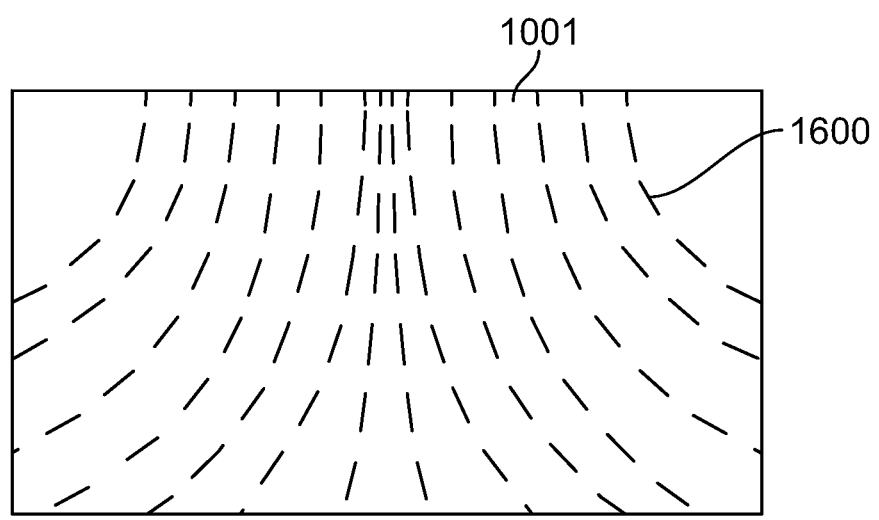
FIG. 16 schematically shows, in a view taken along lines 16-16 (shown in FIG. 11), a different view of the material shown in FIG. 12.

FIG. 16 schematically shows a cross section of easy directions 1600 of grains 1001 taken along view lines 16-16 (shown in FIG. 11). The view in FIG. 16 shows a cross section that is displaced, along the $L_1$ axis, relative to the view in FIG. 14, in a direction away from the center of die 1000. Easy directions 1600 are arranged in substantially the same pattern as that in which easy directions 1400 (shown in FIG. 14) are arranged. This shows that field G (shown in FIG. 10) may be sufficiently uniform in direction $L_1$ that the orientation of grain 1001 easy directions substantially conforms to flux lines 1002 of field G in direction $L_1$. When edge effects are present, easy directions of grains 1001 near the edge of die 1000 may not conform to flux lines 1002 of field G.

Figure 17:
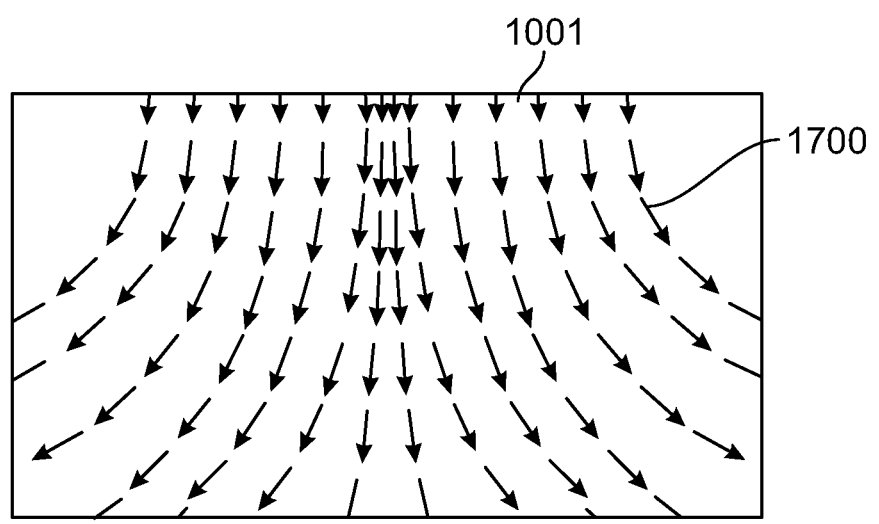
FIG. 17 schematically shows features of the material shown in FIG. 12.

FIG. 17 schematically shows magnetic dipoles 1700 of grains 1001 in the presence of a magnetic field such as G, corresponding to flux lines 1002, or as a result of permanent magnetization by a field conforming to easy directions 1600.

Figure 18:
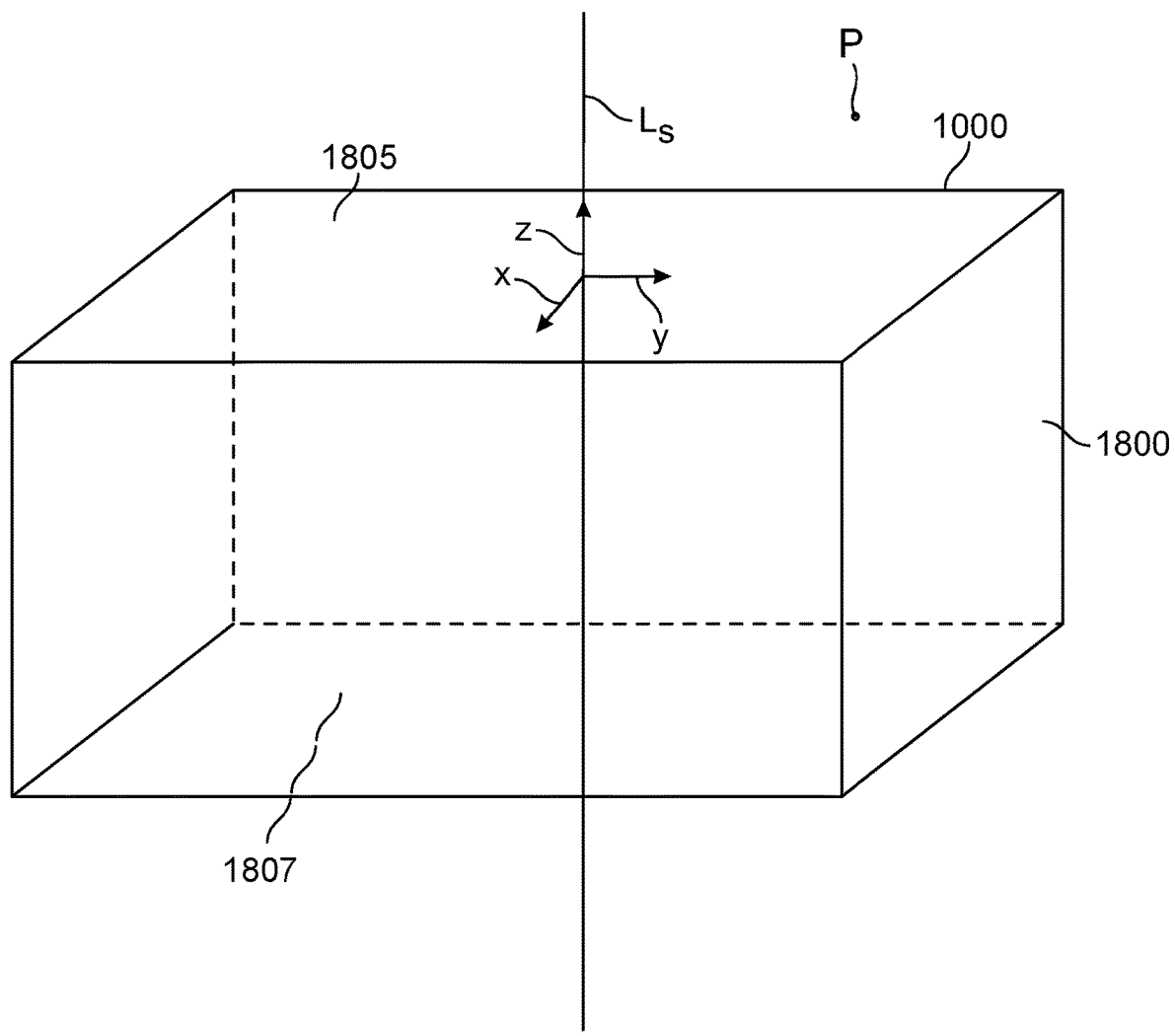
FIG. 18 schematically shows another illustrative product in accordance with the principles of the invention.

FIG. 18 shows illustrative block-shaped magnet 1800, which may be by compression of grains 1001 in die 1000 subject to magnetic field G. After compression, grains 1001 were sintered in an oven and cooled. A magnetic field H' was applied to magnet 1800 to remagnetize magnet 1800 after sintering. Magnetic field G' may be a substantially uniform linear (i.e., not shaped) magnetic field. Magnetic field G' may be shaped to coincide with the easy directions induced prior to sintering by magnetic field G. After removal of magnetic field G', magnet 1800 retains magnetic dipoles that generate external magnetic field G".

Field G" at point P has normal component $G''_z$ and orthogonal horizontal components $G''_x$ and $G''_y$. The magnitudes of the components may depend on the composition of grains 1001, the overall density of grains 1001, the degree of compression of grains 1001, the strength of fields G and G', the shape fields G and G', magnet thickness t, magnet diameter D and other factors.

Magnet 1800 may have hot side 1805. Magnet 1800 may include cold side 1807. Magnetic field strength adjacent hot side 1805 may be greater than that adjacent cold side 1807.

Table 3 shows illustrative modeled field magnitudes $G''_z$ ($x=x_{midpoint}$, $y=y_{midpoint}$, $z=4$ mm) for a magnet such as 1800 when the average polarization is 1.02 Tesla, the magnet has horizontal dimensions of 30.15+/−0.05 mm and 13.8+/−0.05 mm in the x- and y-directions, respectively, and a thickness in the z-direction of about 4.2+/−0.05 mm. The illustrative values are based on finite element model solutions.

TABLE 3

Illustrative values of $G''_z$ for a magnet such as 1800.

| Side of magnet | $G''_z$ (Gauss) |
|---|---|
| Hot | 1500 |
| Cold | 1000 |

Values greater than the hot side values shown in Table 3 may be achieved, for example, by increasing one or more of the overall density of grains 201, the degree of compression of grains 201, the strength of field H, the strength of field H', the curvature of field H, the curvature of field H' and any other suitable factor. The higher values may be from about 1% to about 2%, from about 2% to about 3%, from about 3% to about 4%, from about 4% to about 5%, from about 5% to about 6%, from about 6% to about 7%, from about 7% to about 8%, from about 8% to about 9%, from about 9% to about 10%, from about 10% to about 12%, from about 12% to about 14%, from about 14% to about 16%, from about 16% to about 18%, from about 18% to about 20%, from about 20% to about 25%, and from about 25% to about 30% higher, or more than 30% higher, than the values shown in Table 3.

Values lesser than the cold side values shown in Table 3 may be achieved, for example, by increasing one or more of the overall density of grains 201, the degree of compression of grains 201, the strength of field H, the strength of field H', the curvature of field H, the curvature of field H' and any other suitable factor. The lower values may be from about 1% to about 2%, from about 2% to about 3%, from about 3% to about 4%, from about 4% to about 5%, from about 5% to about 6%, from about 6% to about 7%, from about 7% to about 8%, from about 8% to about 9%, from about 9% to about 10%, from about 10% to about 12%, from about 12% to about 14%, from about 14% to about 16%, from about 16% to about 18%, from about 18% to about 20%, from about 20% to about 25%, and from about 25% to about 30% lower, or more than 30% lower, than the values shown in Table 3.

Figure 19:
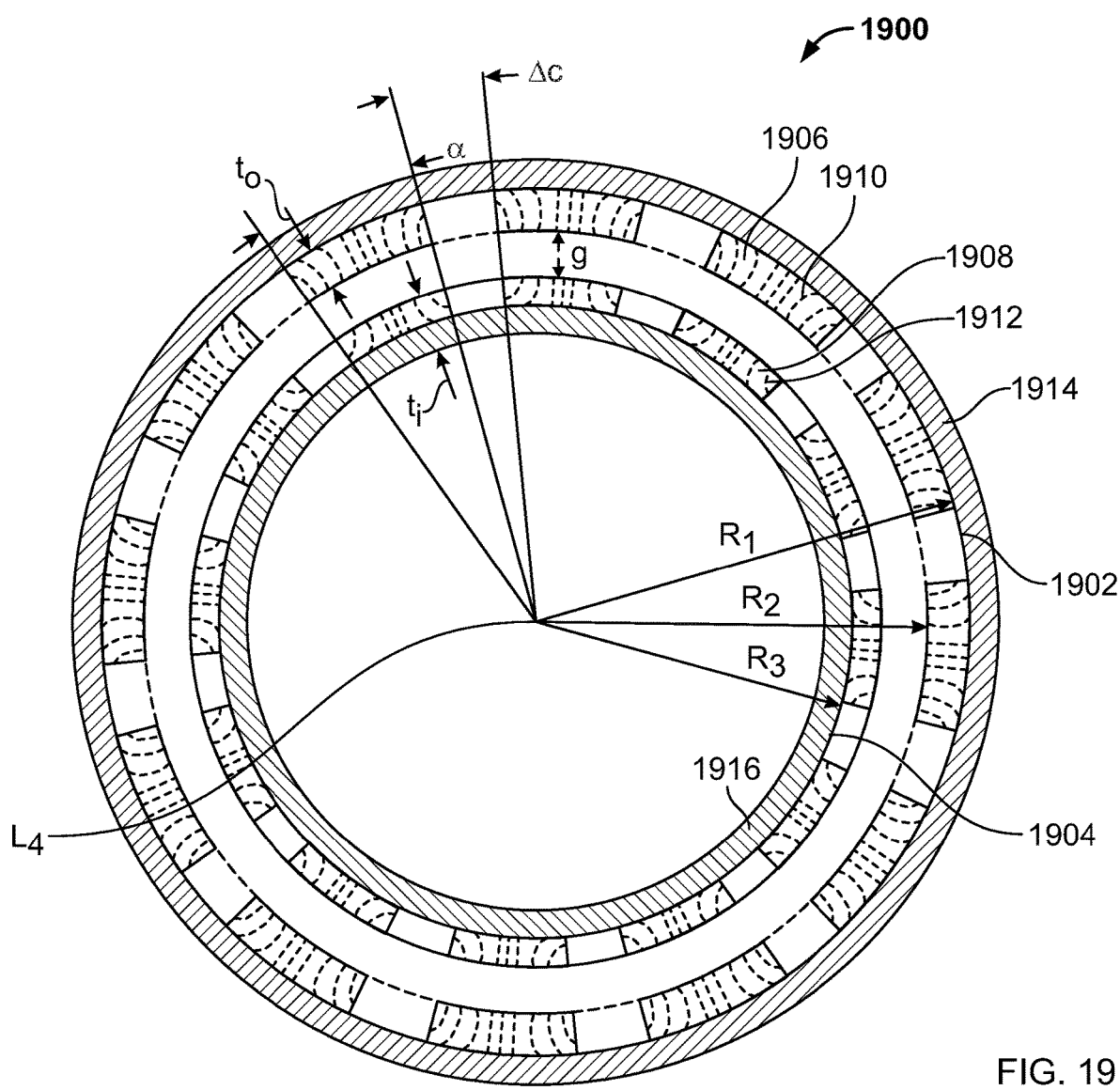
FIG. 19 schematically shows another illustrative product in accordance with the principles of the invention.

FIG. 19 shows illustrative magnetic torque coupler 1900. Torque coupler 1900 may include outer rotor 1902. Torque coupler 1900 may include inner rotor 1904. Outer rotor 1902 may include one or more outer magnetic poles such as 1906. Pole 1906 may be a magnet such as magnet 1800 (shown in FIG. 18). Inner rotor 1904 may include one or more inner magnetic poles such as 1908. Pole 1908 may be a magnet such as magnet 1800. Pole 1906 may have inner and outer radial faces that are concentric with each other. Pole 1908 may have inner and outer radial faces that are concentric with each other. Pole 1906 may include sintered grains that have magnetic easy directions 1910 that are patterned to focus magnetic flux toward a central region of pole 1908. Pole 1908 may include sintered grains that have magnetic easy directions 1912 that are patterned to focus magnetic flux toward a central region of pole 1906. The flux may be more focused than the focus of poles that generate radial flux.

Outer rotor 1902 may magnetically couple to inner rotor 1904 to transfer torque about axis L4. The focused flux may provide 1, 2, 3, 4, 5, 6, 7, 8, 9, 10, 11, 12, 13, 14, 15, 16, 17, 18, 19, 20, 21, 22, 23, 24 or 25% more torque transfer than rotors that are coupled by non-focused flux.

The poles may span arc α. The poles may be separated circumferentially by arc Δc. Outer pole 1906 may have thickness to. Inner pole 1908 may have thickness $t_i$. Outer pole 1906 may be set apart from inner pole 1908 by radial gap g.

Outer rotor 1902 may include annular support 1914. Inner rotor 1904 may include annular support 1916. The annular supports may support the poles. One or both of the annular supports may include a high magnetic permeability material. One or both of the annular supports may include a low permeability magnetic material.

Figure 20:
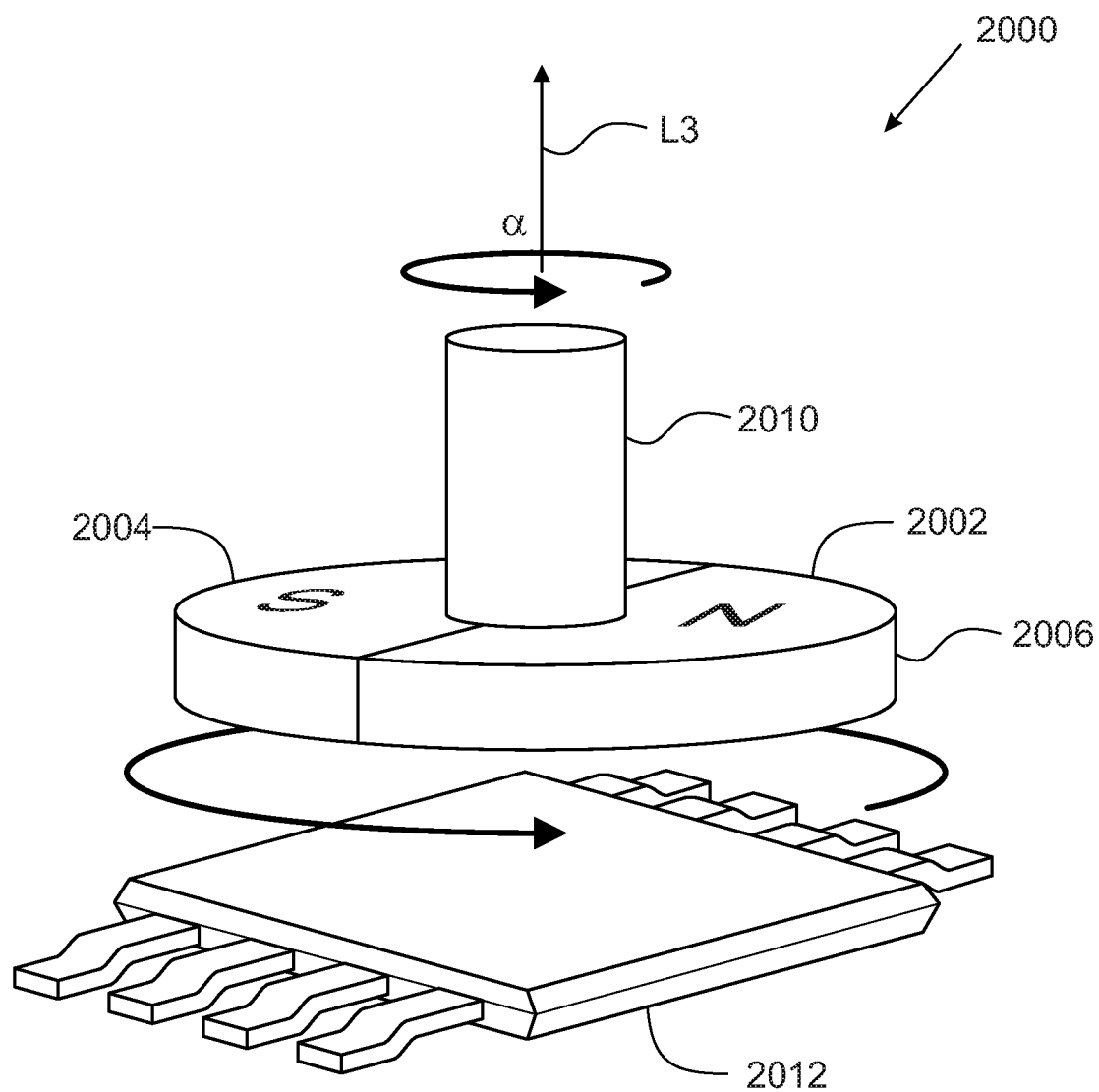
FIG. 20 schematically shows yet another illustrative product in accordance with the principles of the invention.

FIG. 20 shows illustrative angle sensor 2000. Sensor 2000 may include magnetic 2002. Magnet 2002 may have one or more features in common with magnet 900 (shown in FIG. 9). Magnet 2002 may include south pole region 2004. Magnet 2002 may include north pole region 2006. Magnet 2002 may include a central transitional region (not shown) between south pole region 2004 and north pole region 2006. Magnet 2002 may be fixed to rod 2010. Magnet 2002 may rotate about axis $L_3$ through angle α.

Sensor 2000 may include Hall effect sensor 2012. Hall effect sensor 2012 may include a circuit (not shown) that is responsive to a magnetic field generated by magnet 2002. Hall effect sensor 2012 may be responsive to a component of the magnetic field that is parallel to axis $L_3$ at a location that is radially set apart from axis $L_3$.

Figure 21:
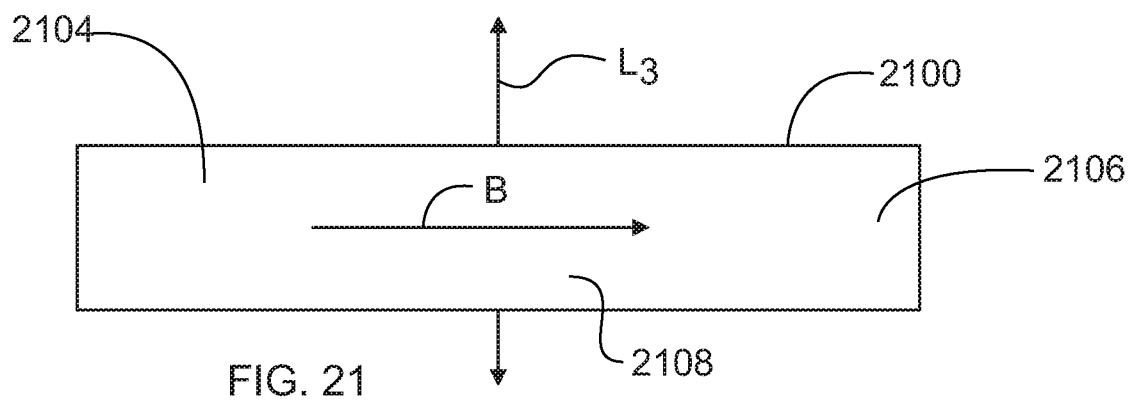
FIG. 21 schematically shows a diametric magnet.

FIG. 21 shows a schematic cross section of magnet 2100. Magnet 2100 may include south pole region 2104. Magnet 2100 may include north pole region 2106. Magnet 2100 may include central transitional region 2108 between south pole region 2104 and north pole region 2106. Arrow B indicates that easy directions of grains in 2100 are substantially parallel to a diameter of magnet 2100.

Figure 22:
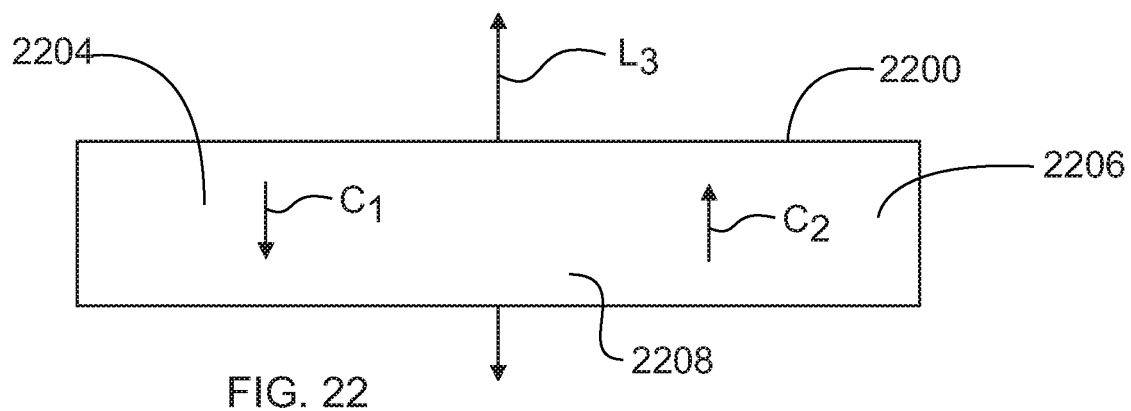
FIG. 22 schematically shows a two-pole magnet.

FIG. 22 shows a schematic cross section of magnet 2200. Magnet 2200 may include south pole region 2204. Magnet 2200 may include north pole region 2206. Magnet 2200 may include central transitional region 2208 between south pole region 2204 and north pole region 2206. Arrow $C_1$ indicates that easy directions of grains in region 2204 are substantially parallel to axis $L_3$ of magnet 2200 and that corresponding magnetic dipoles are pointing "down." Arrow $C_2$ indicates that easy directions of grains in region 2206 are substantially parallel to axis $L_3$ of magnet 2200 and that corresponding magnetic dipoles are pointing "up." Because of the alignment of the easy directions, magnet 2200 may be said to have "axial 2-pole" magnetization.

Figure 23:
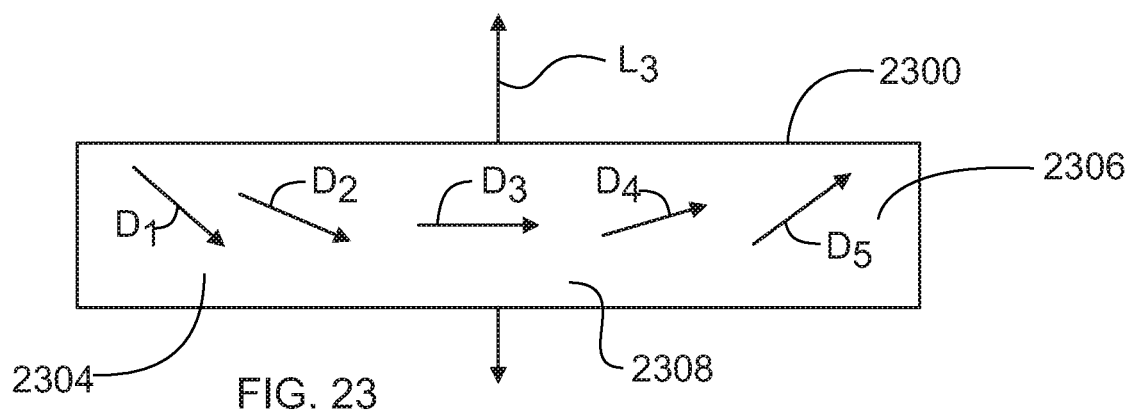
FIG. 23 schematically shows still another illustrative product in accordance with the principles of the invention.

FIG. 23 shows a schematic cross section of magnet 2300. Magnet 2300 may have one or more features in common with magnet 900 (shown in FIG. 9). Magnet 2300 may include south pole region 2304. Magnet 2300 may include north pole region 2306. Magnet 2300 may include central transitional region 2308 between south pole region 2304 and north pole region 2306. Arrows $D_1$, $D_2$, $D_3$, $D_4$ and $D_5$ indicate that the orientations of easy directions of grains in magnet 2300 vary from region 2304 to region 2306.

FIG. 24 shows schematically press 2400. Press 2400, or any other suitable press, may be used to generate the forces and fields shown in FIG. 2. Press 2400 may include punch 2402. Press 2400 may include punch 2404. Punches 2402 and 2404 may be aligned along axis $L_3$. Press 2400 may include die 2406. Press 2400 may include coils 2408. Coils 2408 may be aligned along axis $L_2$. Axis $L_2$ may perpendicular to axis $L_3$. Magnetic powder 2401 may be deformed in die 2406 while subjected to a magnetic field generated by coils 2408.

FIG. 25 shows schematically press 2500. Press 2500, or any other suitable press, may be used to generate the forces and fields shown in FIG. 11. Press 2500 may include punch 2502. Press 2500 may include punch 2504. Punches 2502 and 2504 may be aligned along axis $L_3$. Press 2500 may include die 2506. Press 2500 may include coils 2508. Coils 2508 may be aligned along axis $L_3$. Axis $L_2$ may perpendicular to axis $L_3$. Magnetic powder 2501 may be deformed in die 2506 while subjected to a magnetic field generated by coils 2508.

FIG. 26 shows illustrative powder compact shapes represented by 2-dimensional views 2630, 2640, 2650 and 2660. The views are intended to be illustrative of views parallel to axis $L_2$ and views parallel to axis $L_3$. One or more of the shapes may be produced using a press such as press 2400 or any other suitable press. One or more of the shapes may be produced using a press such as press 2500 or any other suitable press. The powder compacts having the shapes may have one or more of the features of magnet 900 (shown in FIG. 9). The powder compacts having the shapes may have one or more of the features of magnet 1800 (shown in FIG. 18).

Figure 27:
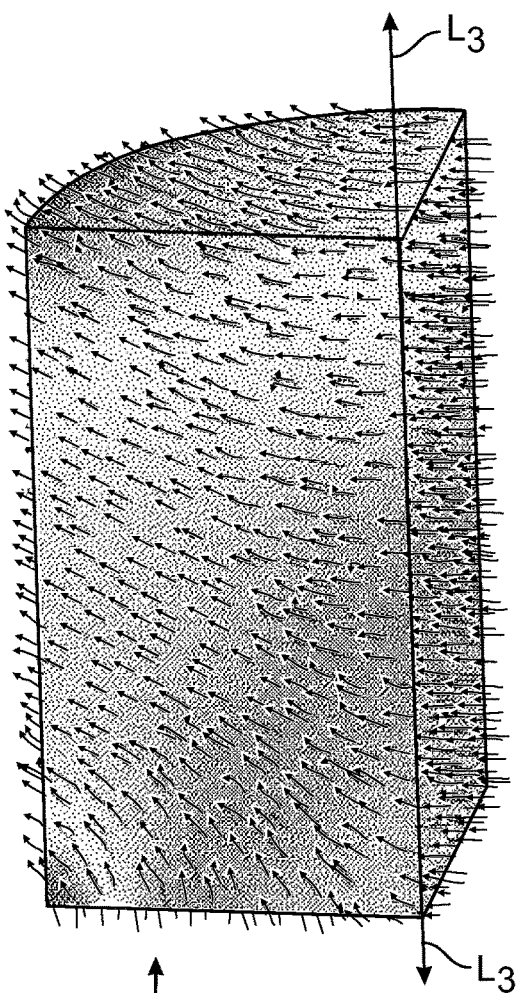
FIG. 27 shows information that illustrates principles of the invention.

FIG. 27 shows an illustrative finite element solution of magnetic field strength and direction inside a 3-dimensional quadrant of a powder compact such as one that may be used for preparation of a magnet such as magnet 900 (shown in FIG. 9) in the presence of an external magnetic field such as H (shown in FIG. 2).

Figure 28:
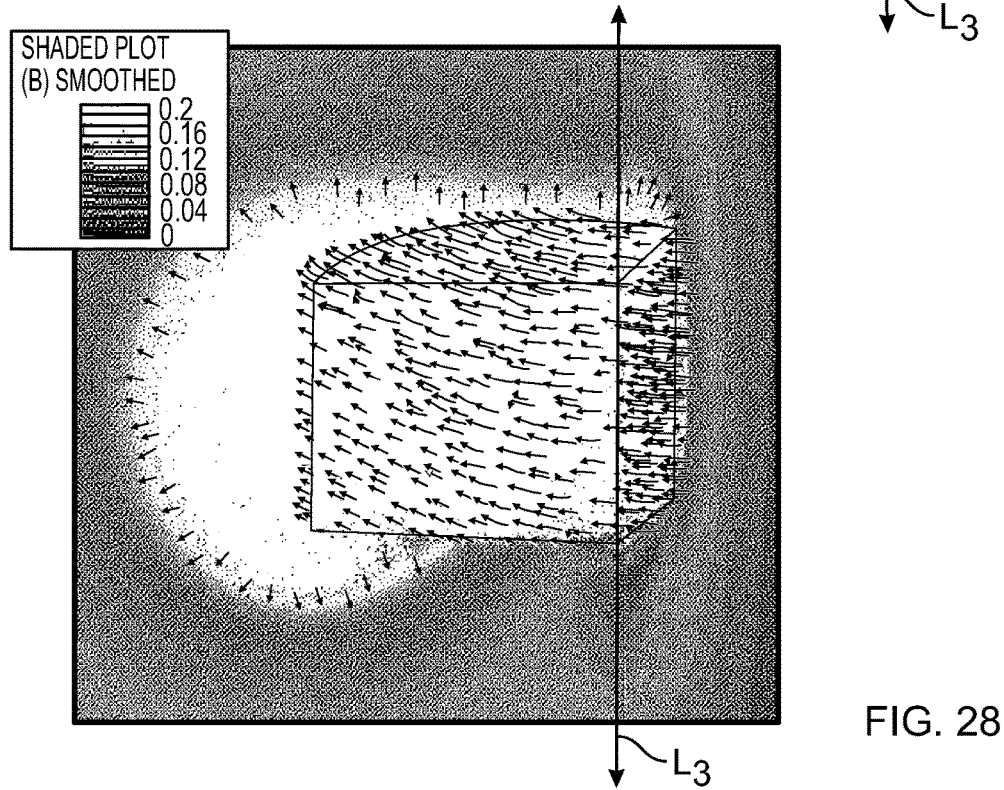
FIG. 28 shows other information that illustrates principles of the invention.

FIG. 28 shows an illustrative finite element solution of magnetic field strength and direction inside a quadrant such as the quadrant shown in FIG. 27, but after compaction in the presence of external field H (shown in FIG. 2), sintering, cooling, and magnetization by a field such as H' (discussed above).

Figure 29:
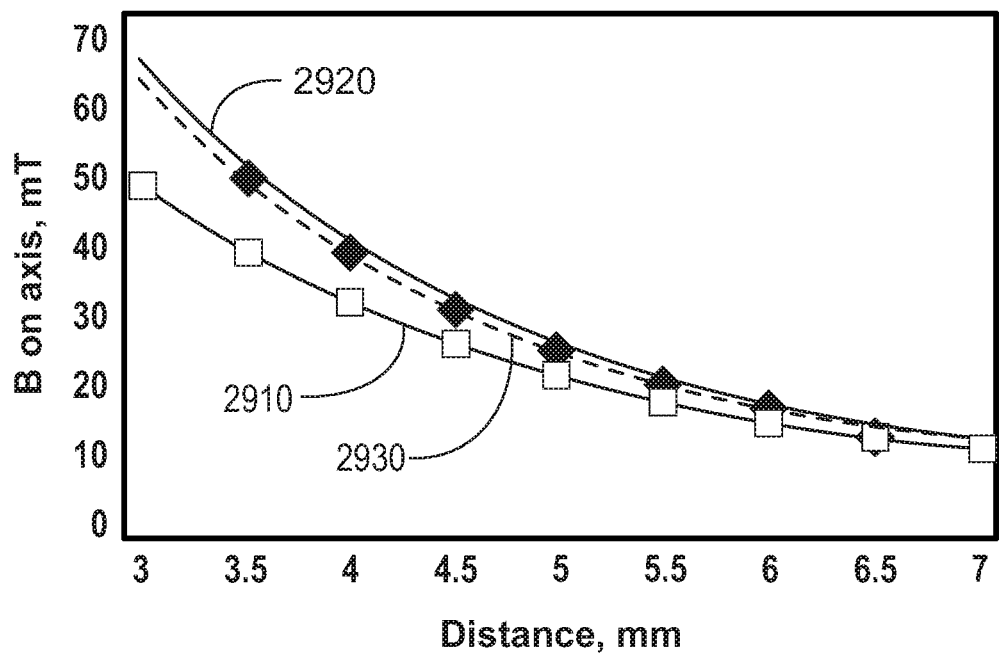
FIG. 29 shows still other information that illustrates principles of the invention.

FIG. 29 shows circumferential field strength ($H''_\theta$, in FIG. 9, but identified in FIG. 29 as "B on axis") at different distances (z, in FIG. 9) from the center of a face of a cylindrical magnet having diameter 6.5 mm, thickness 2.5 mm and partial composition 2% Sm, 17% Co and average polarization of 1.05 Tesla. Curve 2910 is calculated strength when the magnet has diametric magnetization. Curve 2920 is calculated strength when the magnet has magnetization that varies across the magnet, such as in magnet 900 (shown in FIG. 9). Curve 2930 is measured strength for an actual magnet corresponding to curve 2920. The magnet having varying magnetization has, at a given distance from the surface, about 20% greater field strength than calculated for the diametrically magnetized magnet. The magnet having varying magnetization has a field that, for a given length, has 5 mm greater "reach" than calculated for the diametrically magnetized magnet. The magnet having varying magnetization can have a volume that is 30% less than the calculated volume of diametrically magnetized magnet and produce a field of equivalent strength adjacent the face.

Figure 30:
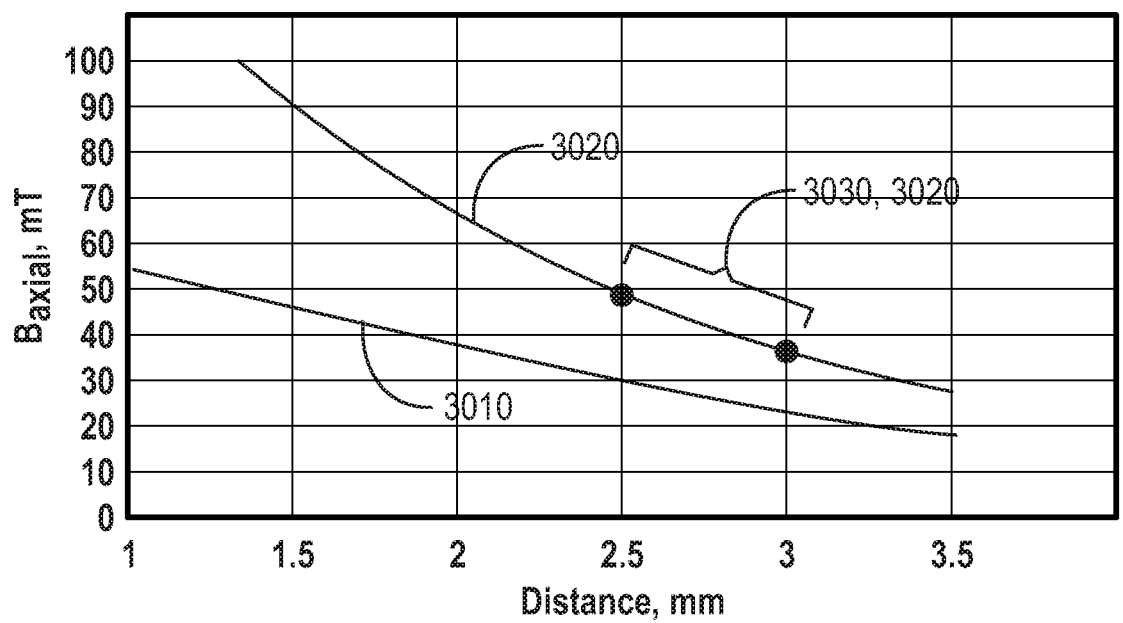
FIG. 30 shows yet other information that illustrates principles of the invention.

FIG. 30 shows axial field strength ($H''_z$, in FIG. 9 and identified in FIG. 30 as "$B_{axial}$") at different distances z (shown in FIG. 9), with r set at 1.1 mm, from a face of a cylindrical magnet having diameter 6.5 mm, thickness 2.5 mm and partial composition 2% Sm, 17% Co. Curve 3010 is calculated strength when the magnet has diametric magnetization. Curve 3020 is calculated strength when the magnet has magnetization that varies across the magnet, such as in magnet 900 (shown in FIG. 9). Curve 3030 is measured strength for an actual magnet corresponding to curve 3020. (Curve 3030 includes data only at distance=2.5 and 3 mm and plots on top of curve 3020 at those distances.)

Figure 31:
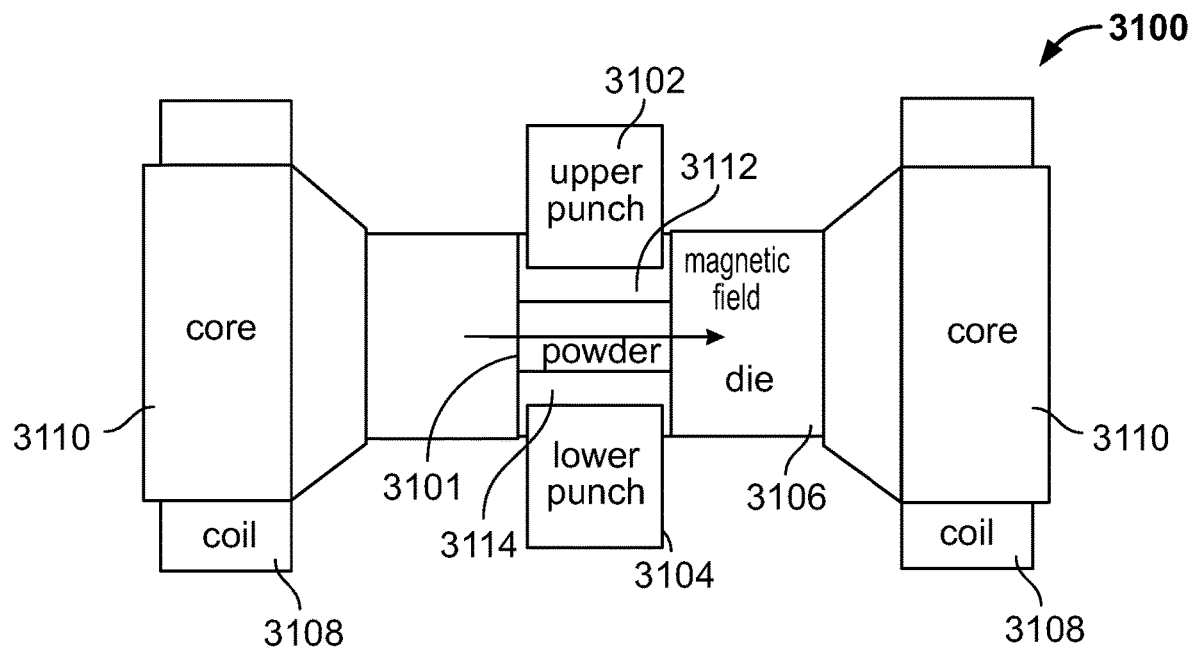
FIG. 31 shows yet other illustrative apparatus in accordance with the principles of the invention.

FIG. 31 shows illustrative transverse press 3100. Transverse press 3100 may have one or more features in common with the arrangement shown in FIG. 2. Transverse press 3100 may have one or more features in common with press 2400 (shown in FIG. 24). Transverse press 3100 may include compression punches 3102 and 3104. Punch 3102 may include boot 3112. Punch 3104 may include boot 3114. Punches 3102 and 3104 may compress powder 3101 in die 3106 in a direction that is transverse to a magnetic field (shown in arrow) induced by coils 3108 and amplified by cores 3110.

Figure 32:
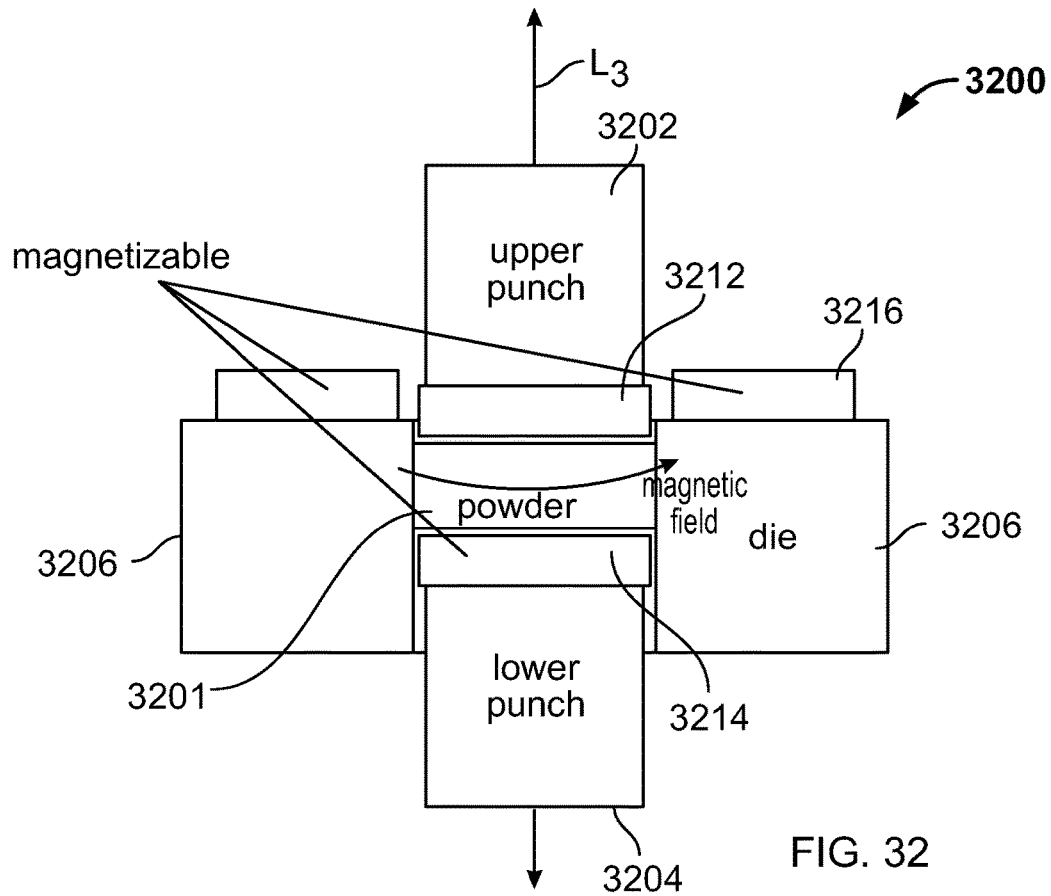
FIG. 32 shows yet other illustrative apparatus in accordance with the principles of the invention.

FIG. 32 shows illustrative transverse press 3200. Transverse press 3200 may have one or more features in common with the arrangement shown in FIG. 2. Transverse press 3200 may have one or more features in common with press 2400 (shown in FIG. 24). Transverse press 3200 may include compression punches 3202 and 3204. Punch 3202 may include boot 3212. Punch 3204 may include boot 3214. Punches 3202 and 3204 may compress powder 3201 in die 3206 in a direction that is largely transverse to a magnetic field (shown in arrow) induced by coils (not shown) and amplified by cores (not shown). Press 3200 may include field adjustment ring 3216.

One or more of punch 3202, punch 3204, boot 3212, boot 3214, die 3206 and ring 3216 may include high permeability material to deflect the magnetic field along axis $L_3$, as shown, for example, in FIG. 2. One or more of punch 3202, punch 3204, boot 3212, boot 3214, die 3206 and ring 3216 may include low permeability material to deflect the magnetic field along axis $L_3$, as shown, for example, in FIG. 2. In some embodiments, punch 3204, boot 3214 and ring 3216 may include high permeability materials and punch 3202, boot 3212 and die 3206 may include low permeability materials. Punch 3202, boot 3212 and die 3206 may include exclusively low permeability materials.

High permeability materials may include any suitable high permeability materials. Die 3206 may be displaced along axis $L_3$ during compression of powder 3201. Displacing die 3206 during compression may improve the conformance of grain easy directions to a field such as H (shown in FIG. 2). Displacing die 3206 during compression may increase the curvature (or decrease the radius of curvature) of contours along which grain easy directions are aligned.

Figure 33:
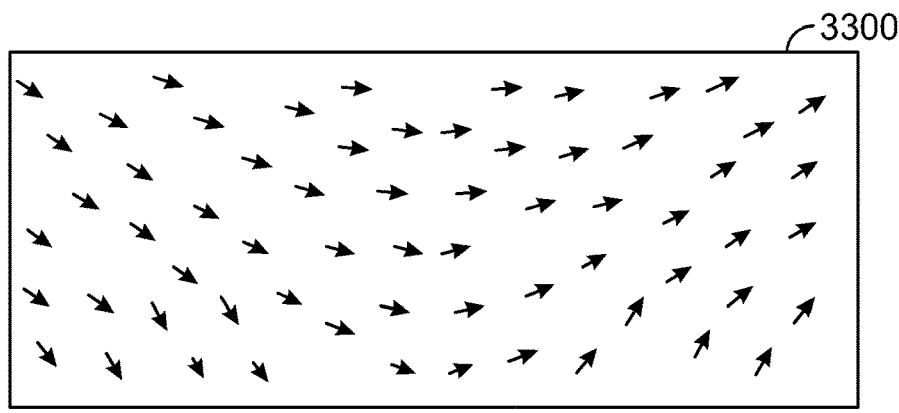
FIG. 33 shows yet other information that illustrates principles of the invention.

FIG. 33 shows schematic finite element solution 3300 showing field direction and magnitude at different locations in a cross section of a magnet produced by press 3200 (shown in FIG. 32).

Figure 34:
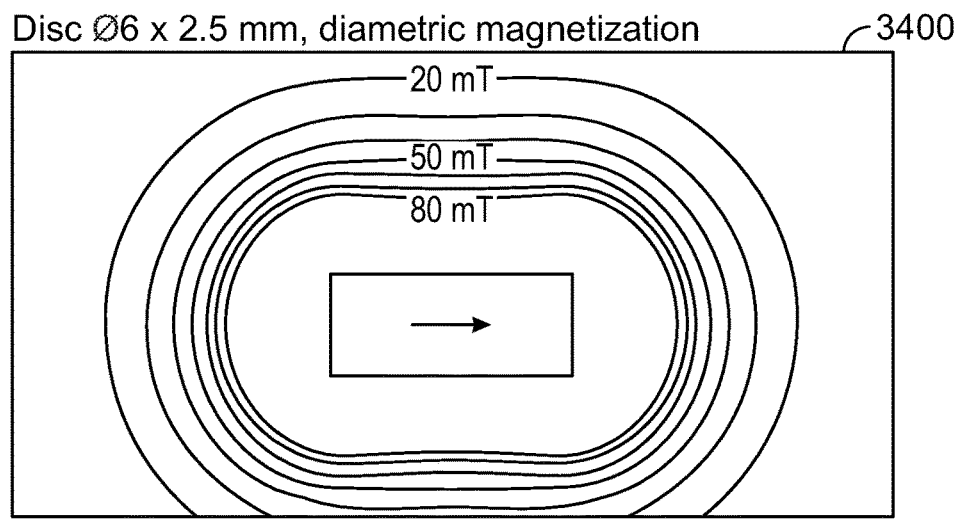
FIG. 34 shows yet other information that illustrates principles of the invention.

FIG. 34 shows contours 3400 of constant magnetic field strength around a magnet having diametric magnetization.

Figure 35:
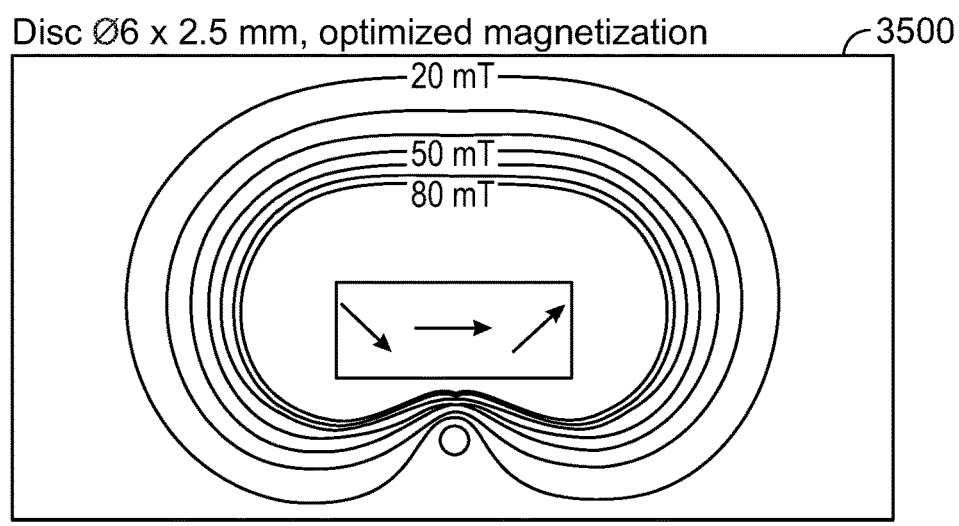
FIG. 35 shows yet other information that illustrates principles of the invention.

FIG. 35 shows contours 3500 of constant magnetic field strength, corresponding to a field such as H", about magnet such as 800 (shown in FIG. 9) having the same external dimensions as the magnet illustrated in FIG. 34.

Figure 36:
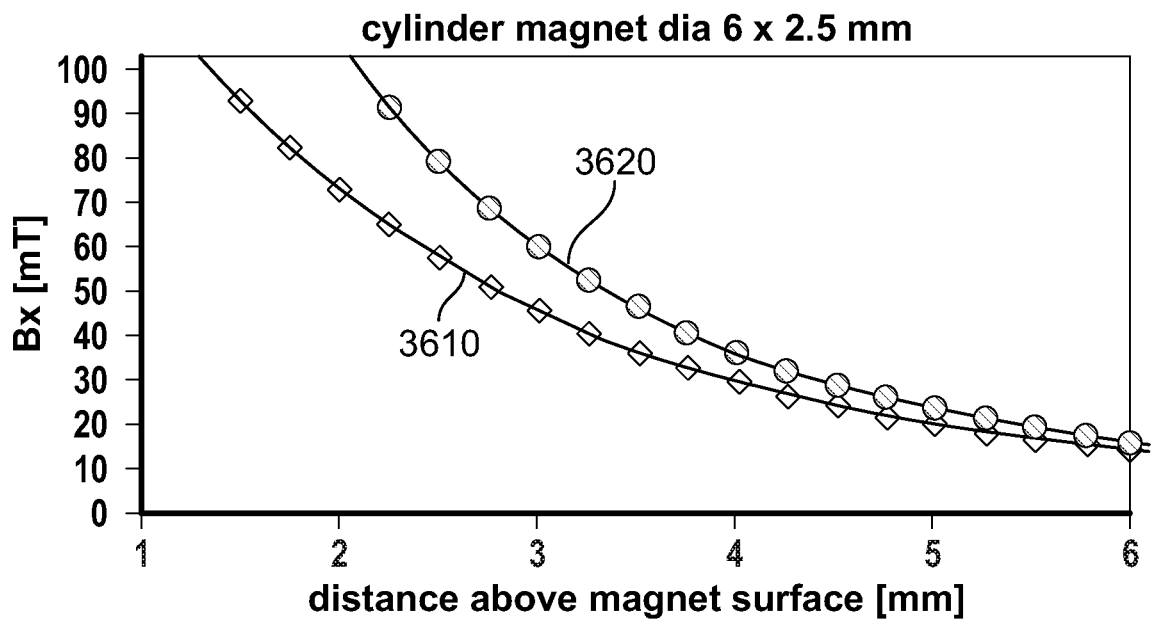
FIG. 36 shows yet other information that illustrates principles of the invention.

FIG. 36 shows circumferential field strength ($H''_\theta$, in FIG. 9, but identified in FIG. 36 as "$B_x$") at different distances (z, in FIG. 9) from the center of a face of a cylindrical magnet having diameter 6.5 mm, thickness 2.5 mm and partial composition 25% Sm, 50% Co. Curve 3610 is calculated strength when the magnet has diametric magnetization. Curve 3620 is calculated strength when the magnet has magnetization that varies across the magnet, such as in magnet 900 (shown in FIG. 9).

Figure 37:
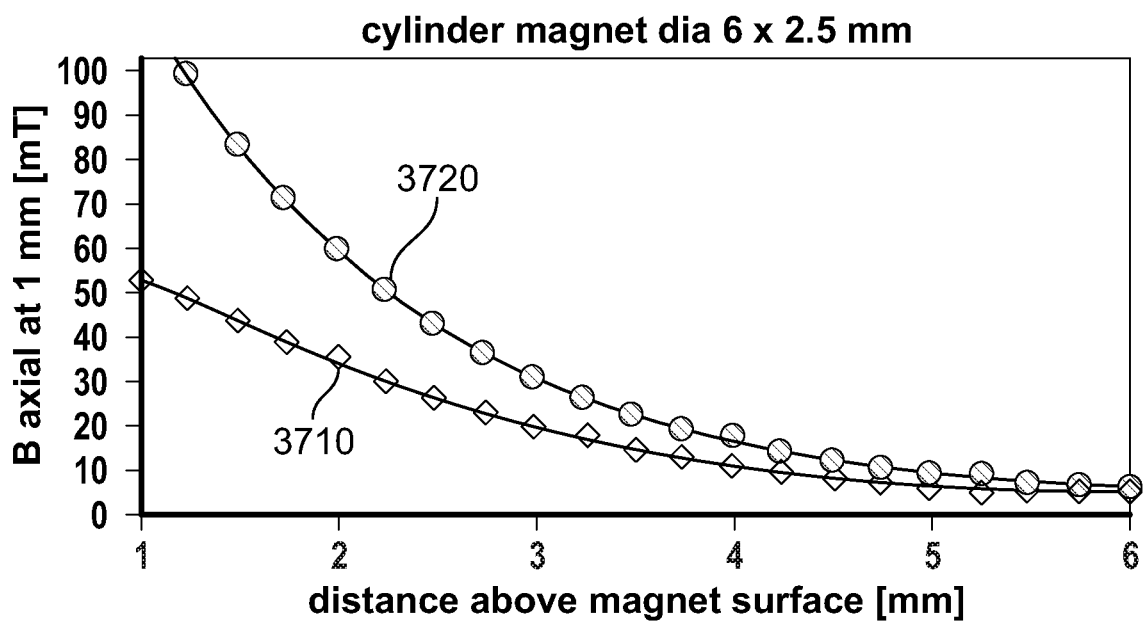
FIG. 37 shows yet other information that illustrates principles of the invention.

FIG. 37 shows axial field strength ($H''_z$, in FIG. 9 and identified in FIG. 37 as "$B_{axial}$") at different distances z (shown in FIG. 9), with r set at 1 mm, from a face of a cylindrical magnet having diameter 6.5 mm, thickness 2.5 mm and partial composition 25% Sm, 50% Co. Curve 3710 is calculated strength when the magnet has diametric magnetization. Curve 3720 is calculated strength when the magnet has magnetization that varies across the magnet, such as in magnet 900 (shown in FIG. 9).

Figure 38:
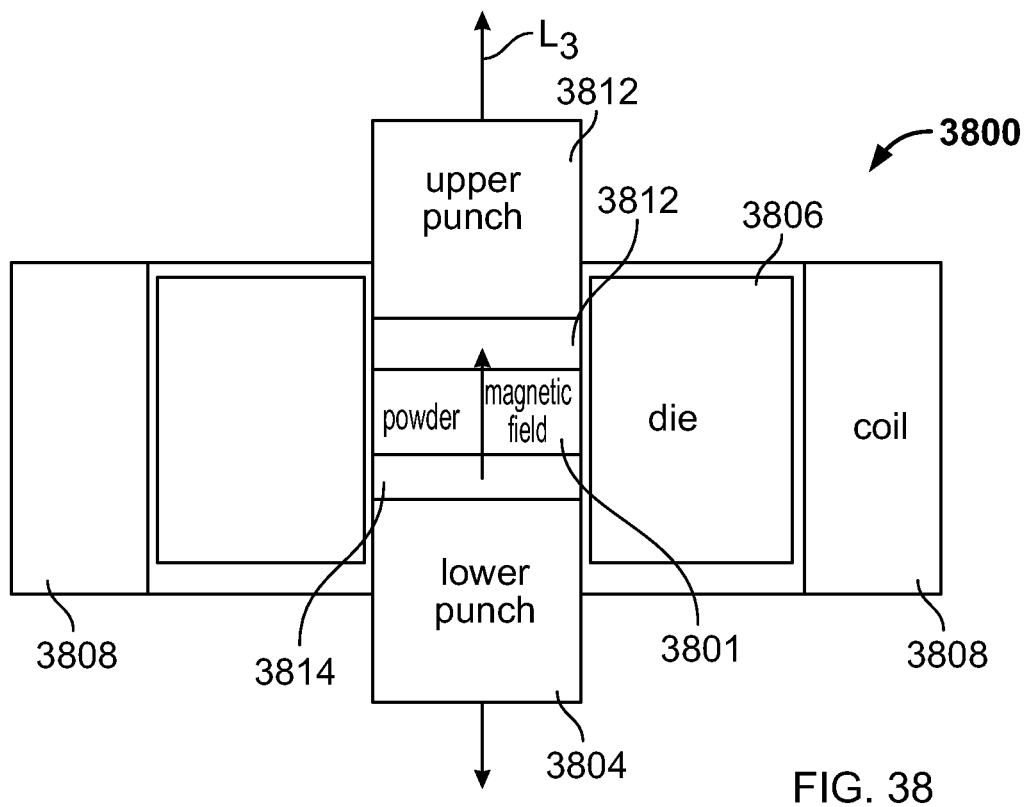
FIG. 38 shows yet other illustrative apparatus in accordance with the principles of the invention.

FIG. 38 shows illustrative axial press 3800. Axial press 3800 may have one or more features in common with the arrangement shown in FIG. 10. Axial press 3800 may have one or more features in common with press 2500 (shown in FIG. 25). Axial press 3800 may include compression punches 3802 and 3804. Punch 3802 may include boot 3812. Punch 3804 may include boot 3814. Punches 3802 and 3804 may compress powder 3801 in die 3806 in a direction that is axial to a magnetic field (shown in arrow) induced by coil 3808.

Figure 39:
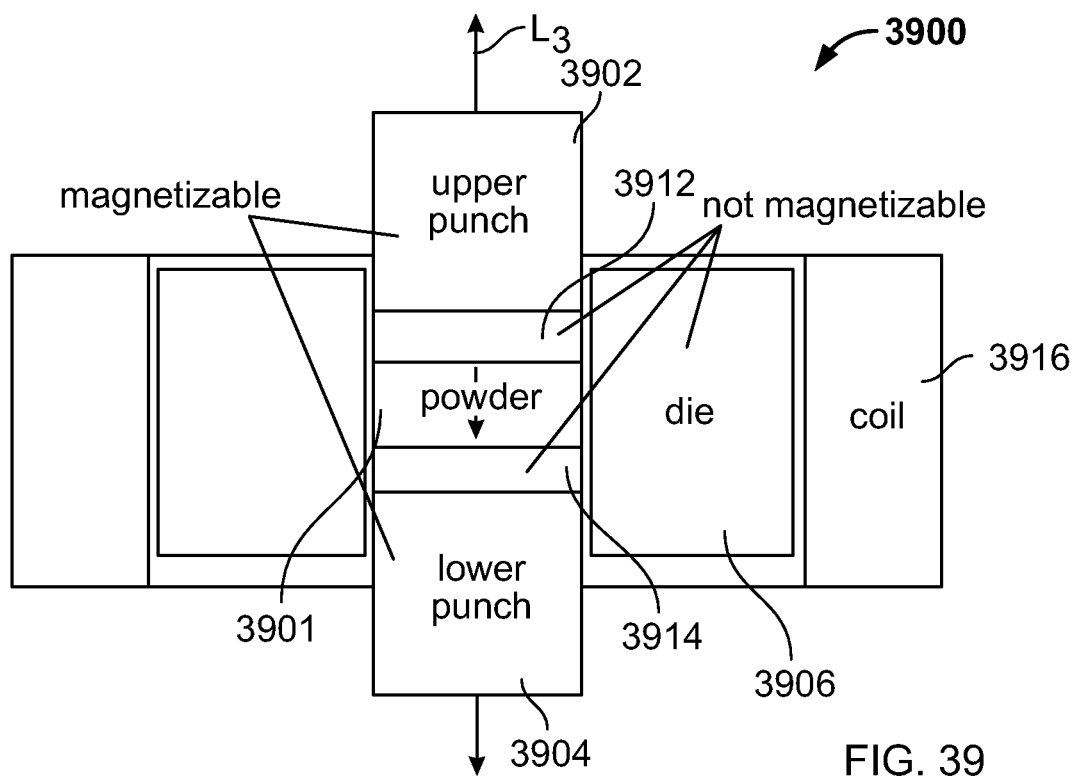
FIG. 39 shows yet other illustrative apparatus in accordance with the principles of the invention.

FIG. 39 shows illustrative axial press 3900. Axial press 3900 may have one or more features in common with the arrangement shown in FIG. 10. Axial press 3900 may have one or more features in common with press 2500 (shown in FIG. 25). Axial press 3900 may include compression punches 3902 and 3904. Punch 3902 may include boot 3912. Punch 3904 may include boot 3914. Punches 3902 and 3904 may compress powder 3901 in die 3906 in a direction that is largely axial to a magnetic field (shown in arrow) induced by coil 3916.

One or more of punch 3902, punch 3904, boot 3912, boot 3914 and die 3906 may include high permeability material to deflect the magnetic field relative to axis $L_3$, as shown, for example, in FIG. 10. One or more of punch 3902, punch 3904, boot 3912, boot 3914 and die 3906 may include low permeability material to deflect the magnetic field relative to axis $L_3$, as shown, for example, in FIG. 10. In some embodiments, punch 3902 and punch 3904 may include high permeability material and boot 3912, boot 3914 and die 3906 may include low permeability material. Boot 3912, boot 3914 and die 3906 may include exclusively low permeability material.

High permeability materials may include any suitable high permeability materials. Low permeability materials may include any suitable low permeability materials. Die 3906 may be displaced along axis $L_3$ during compression of powder 3901. Displacing die 3906 during compression may improve the conformance of grain easy directions to a field such as G (shown in FIG. 10). Displacing die 3906 during compression may increase the curvature (or decrease the radius of curvature) of contours along which grain easy directions are aligned.

Figure 40:
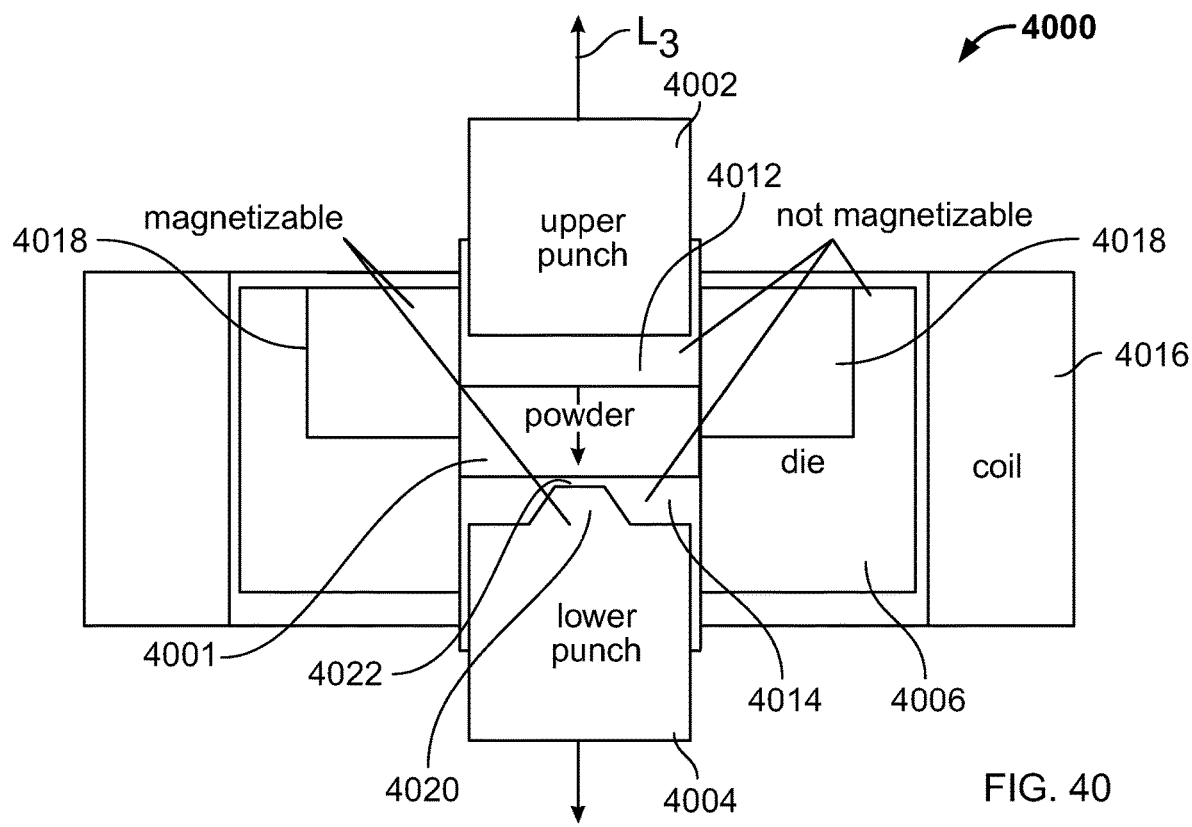
FIG. 40 shows yet other illustrative apparatus in accordance with the principles of the invention.

FIG. 40 shows illustrative axial press 4000. Axial press 4000 may have one or more features in common with the arrangement shown in FIG. 10. Axial press 4000 may have one or more features in common with press 2500 (shown in FIG. 25). Axial press 4000 may include compression punches 4002 and 4004. Punch 4002 may include boot 4012. Punch 4004 may include boot 4014. Punches 4002 and 4004 may compress powder 4001 in die 4006 in a direction that is largely axial to a magnetic field (shown in arrow) induced by coil 4016.

One or more of punch 4002, punch 4004, boot 4012, boot 4014 and die 4006 may include high permeability material to deflect the magnetic field relative to axis $L_3$, as shown, for example, in FIG. 10. One or more of punch 4002, punch 4004, boot 4012, boot 4014 and die 4006 may include low permeability material to deflect the magnetic field relative to axis $L_3$, as shown, for example, in FIG. 10.

Die 4006 may include ring 4018. Ring 4018 may be have any suitable radius, any suitable radial thickness, any suitable axial thickness, any suitable cross-sectional geometry, may be positioned in any suitable location relative to die 4006 and may include any suitable composition. In some embodiments, press 4000 may include a ring such as 4018 that is not within die 4006. Punch 4002 and die 4006, apart from ring 4018, may include low permeability material. Punch 4002 and die 4006, apart from ring 4018, may include exclusively low permeability material.

One or both of the punches may be shaped to enhance deflection of a field such as G (shown in FIG. 10). One or both of the punches may be shaped to enhance deflection of a field such as G (shown in FIG. 10). For example, punch 4004 may include 4020. Nose 4020 may include high permeability material. Nose 4020 may replace a portion of boot 4014, which includes low permeability material. Boot 4014 may include recess 4022, which may conform to nose 4020. Nose 4020 may increase the focusing of field G. In some embodiments, boot 4014 may include a low permeability nose (not shown) and punch 4004 may include a corresponding recess.

Figure 41:
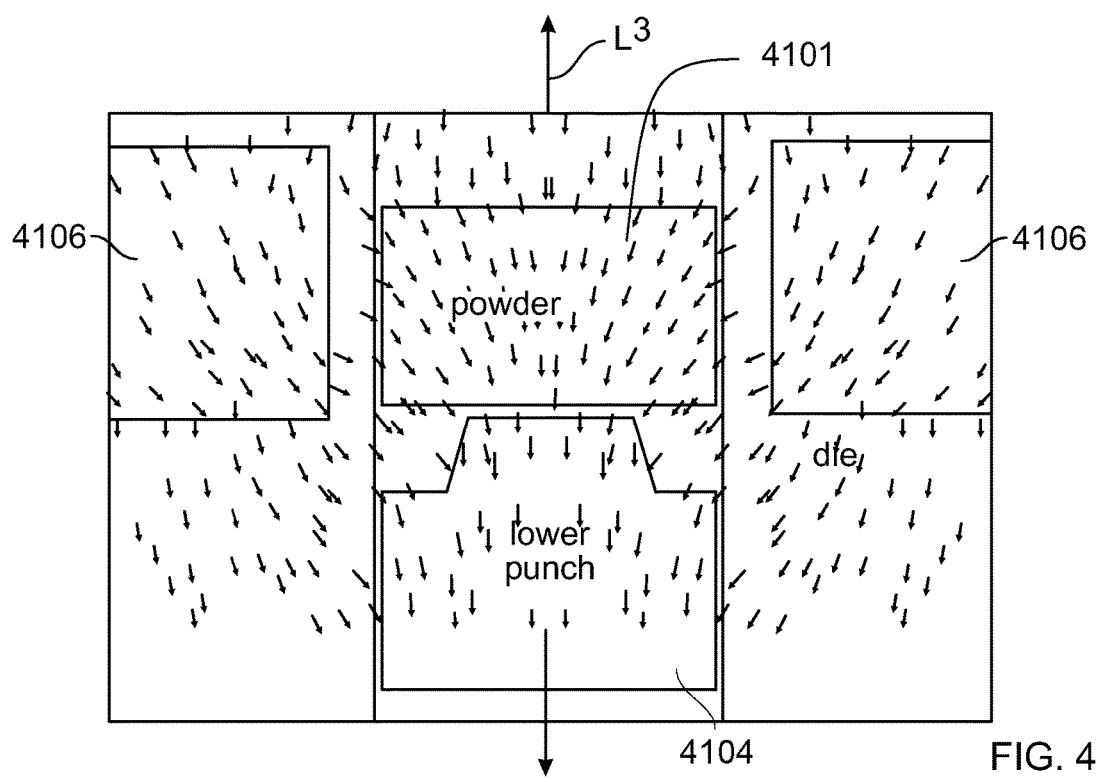
FIG. 41 shows yet other information that illustrates principles of the invention.

FIG. 41 shows an illustrative finite element solution showing magnetic field strength and direction in portions of die 4106, powder 4101 and punch 4104. The magnetic field may be a field such as field G (shown in FIG. 10).

Figure 42:
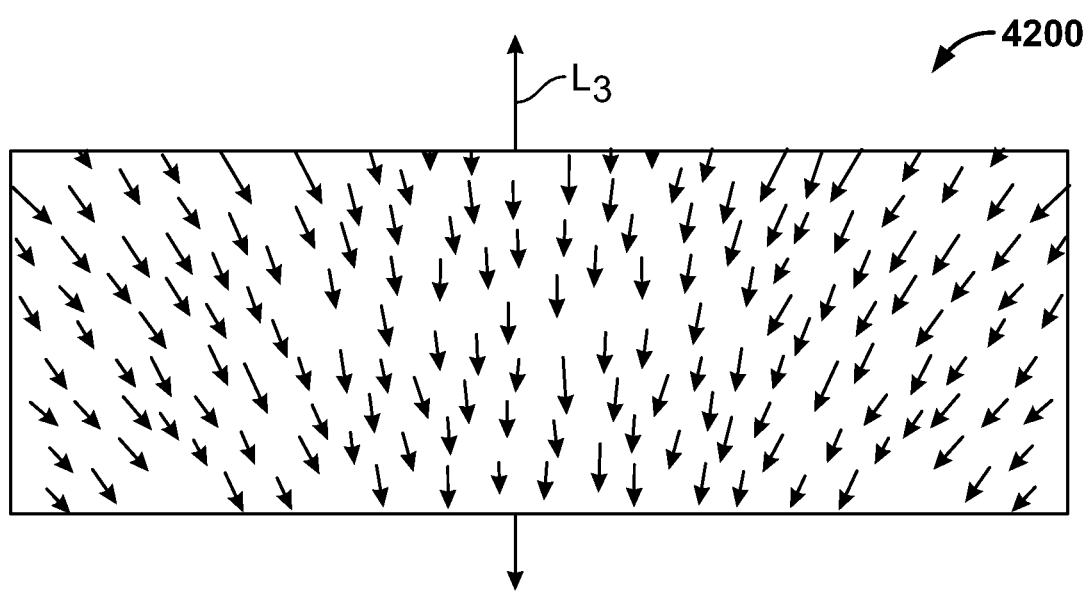
FIG. 42 shows yet other information that illustrates principles of the invention.

FIG. 42 shows illustrative finished magnet 4200. Magnet 4200 may have been prepared by sintering and remagnetizing powder 4101. Magnet 4200 may have been produced using one or more of the processes that were used in connection with magnet 1800 (shown in FIG. 18).

Figure 43:
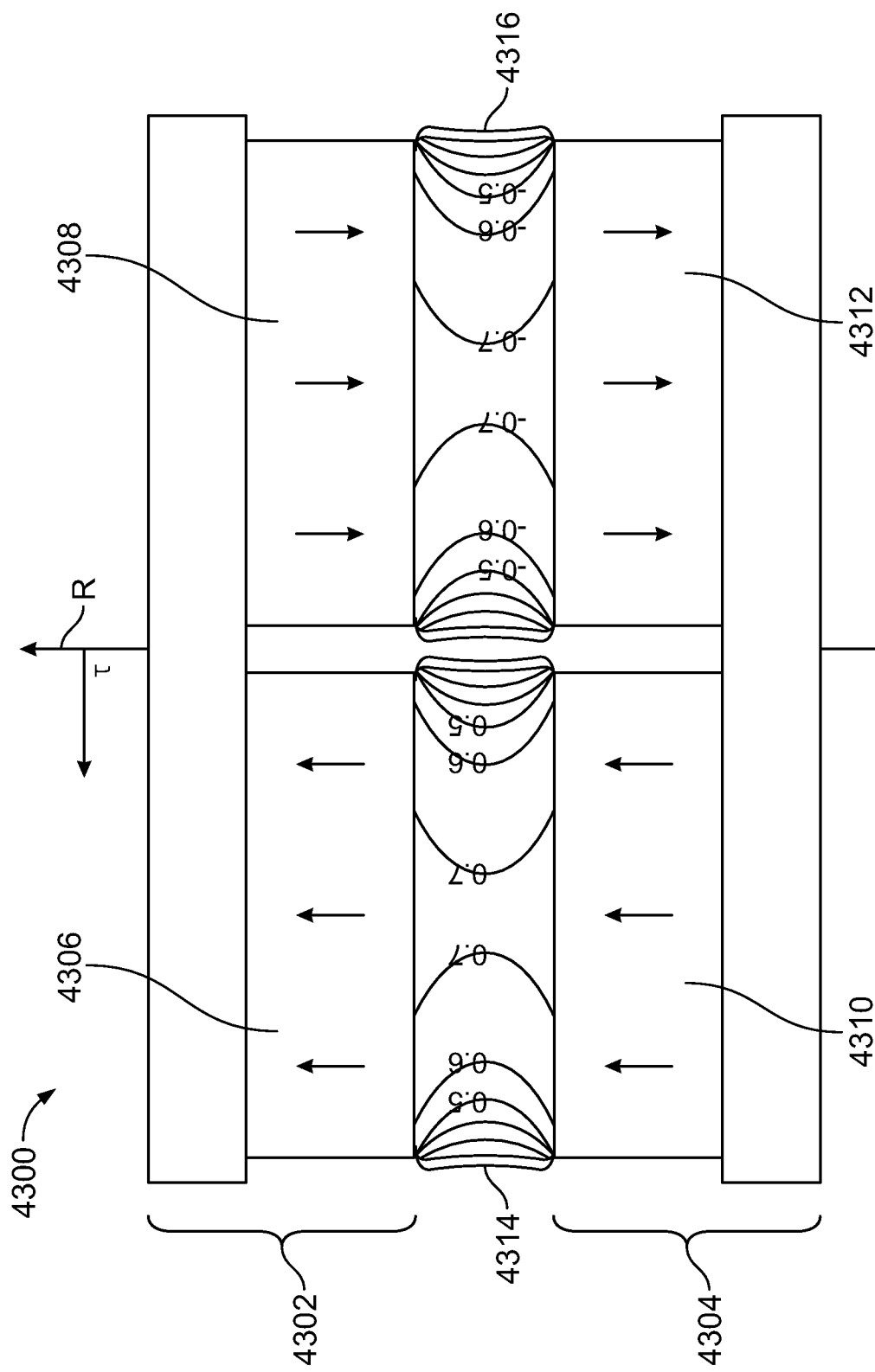
FIG. 43 shows yet other information that illustrates principles of the invention.

FIG. 43 shows schematically illustrative torque coupler 4300. Coupler 4300 may define radial direction R. Coupler 4300 may include outer rotor 4302 and inner rotor 4304. Torque, in direction τ, may be transferred magnetically between outer rotor 4302 and inner rotor 4304. Outer rotor 4302 may include magnetic poles 4306 and 4308. Inner rotor 4304 may include magnetic poles 4310 and 4312, which may be radially opposite poles 4306 and 4308. Contours 4314 show magnetic field strengths in gap 4316 between the opposing poles. Arrows show that the poles include magnetic dipoles that are approximately radially oriented.

The calculated peak field in gap 4316 is 0.71 Tesla.

Figure 44:
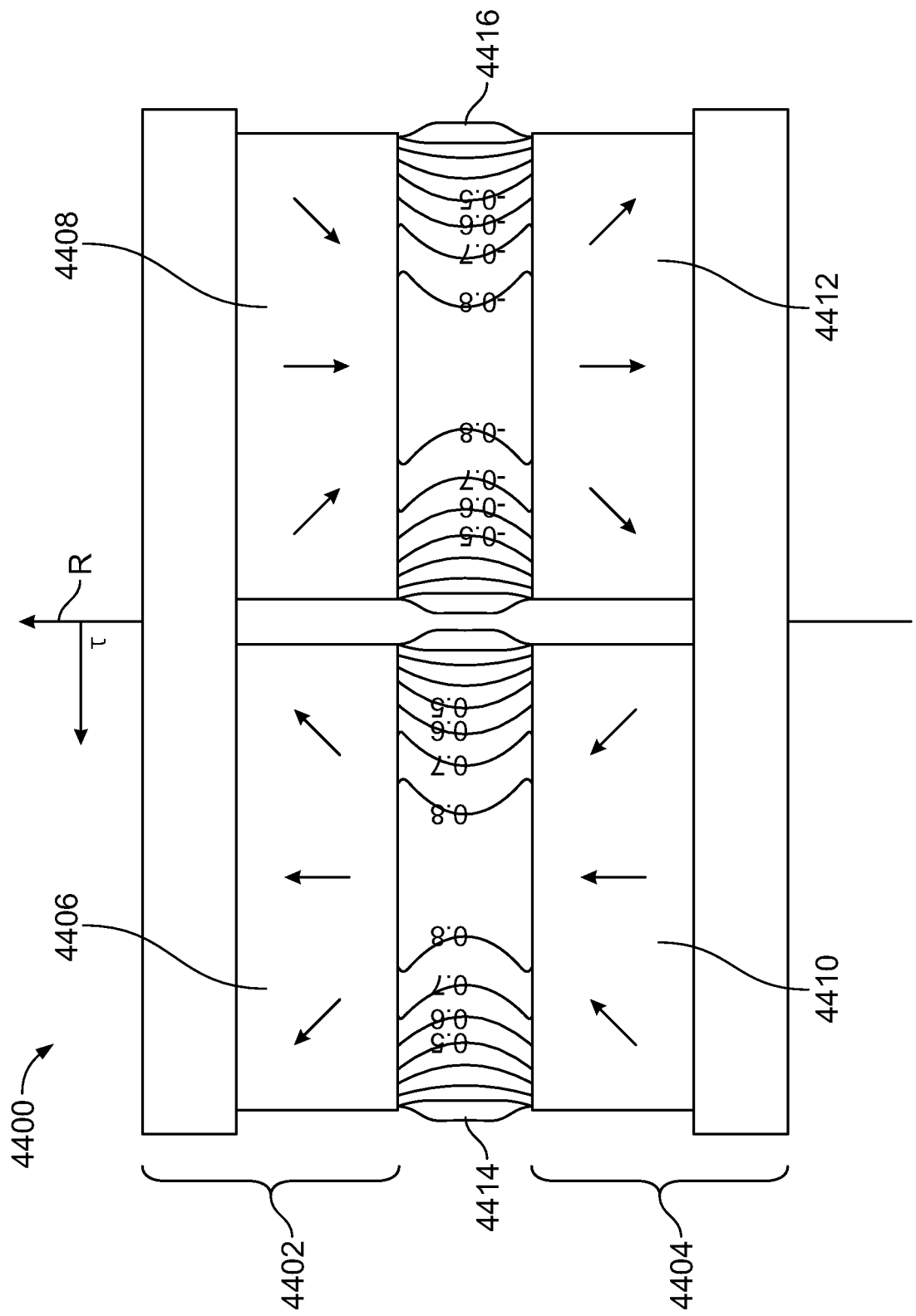
FIG. 44 shows yet other information that illustrates principles of the invention.

FIG. 44 shows schematically illustrative torque coupler 4400. Coupler 4400 may define radial direction R. Coupler 4400 may include outer rotor 4402 and inner rotor 4404. Torque, in direction τ, may be transferred magnetically between outer rotor 4402 and inner rotor 4404. Outer rotor 4402 may include magnetic poles 4406 and 4408. Inner rotor 4404 may include magnetic poles 4410 and 4412, which may be radially opposite poles 4406 and 4408. Contours 4414 show magnetic field strengths in gap 4416 between the opposing poles.

Arrows indicate that the poles include magnetic dipoles that are focused in the radial or anti-radial direction. For example, each of poles 4406, 4408, 4410 and 4412 may have been prepared in the manner of preparation described in connection with magnet 1800 (shown in FIG. 18). Poles 4406, 4408, 4410 and 4412 may have one or more features in common with the poles shown and described in connection with coupler 1900 (shown in FIG. 19).

The calculated peak field in gap 4416 is 0.86 Tesla.

Calculated torque τ in coupler 4400 is 20% greater than calculated torque τ in coupler 4300 (shown in FIG. 43).

Thus, magnets having oriented grains, apparatus and methods for making the magnets, and apparatus incorporating the magnets, have been provided. Persons skilled in the art will appreciate that the present invention can be practiced by other than the described embodiments, which are presented for purposes of illustration rather than of limitation. The present invention is limited only by the claims that follow.

What is claimed is:

1. A sintered hard magnet having a magnetic axis that traverses from a first region of the magnet to a second region of the magnet, the magnet comprising:
   a plurality of first sintered grains in the first region having first magnetic easy directions aligned together substantially parallel to the axis; and
   a plurality of second sintered grains in the second region and set apart from the axis, the second sintered grains having second magnetic easy directions that are inclined away from the axis.

2. A sintered hard magnet comprising:
   a plurality of first sintered grains having first magnetic easy directions substantially aligned together along a plane;
   a plurality of second sintered grains, on one side of the first sintered grains, the second sintered grains having second magnetic easy directions aligned together and inclined obliquely relative to the plane; and
   a plurality of third sintered grains, on an opposite side of the first sintered grains, the third sintered grains having third magnetic easy directions that substantially mirror the second easy directions.

3. The sintered hard magnet of claim 2 wherein:
   the second magnetic easy directions define a second average direction; and
   at least 97% of the second magnetic easy directions are aligned within about 5 degrees of the second average direction.

4. The sintered hard magnet of claim 2 wherein the first, second and third sintered grains are part of a grain network that is interconnected exclusively by contemporaneously grown intergranular necks.

5. The sintered hard magnet of claim 4 wherein easy directions in the network vary substantially continuously between the second and first sintered grains and between the first and third sintered grains.

* * * * *